United States Patent
Inoue et al.

(10) Patent No.: US 10,008,149 B2
(45) Date of Patent: Jun. 26, 2018

(54) LIGHT-EMITTING DEVICE INCLUDING PIXELS SUPPRESSING VARIATION IN LUMINANCE

(75) Inventors: Seiko Inoue, Isehara (JP); Hiroyuki Miyake, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 1376 days.

(21) Appl. No.: 13/547,128

(22) Filed: Jul. 12, 2012

(65) Prior Publication Data
US 2013/0021316 A1 Jan. 24, 2013

(30) Foreign Application Priority Data

Jul. 22, 2011 (JP) .................................. 2011-161103
Nov. 29, 2011 (JP) .................................. 2011-259828

(51) Int. Cl.
*G09G 3/30* (2006.01)
*G09G 3/3233* (2016.01)
(Continued)

(52) U.S. Cl.
CPC ....... *G09G 3/3233* (2013.01); *H01L 27/1225* (2013.01); *G09G 3/3291* (2013.01);
(Continued)

(58) Field of Classification Search
CPC .......................................... G09G 3/30–3/3291
See application file for complete search history.

(56) References Cited

U.S. PATENT DOCUMENTS 5,684,365 A 11/1997 Tang et al.
5,731,856 A 3/1998 Kim et al.
(Continued)

FOREIGN PATENT DOCUMENTS

CN 001758308 A 4/2006
CN 101313348 11/2008
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.
(Continued)

*Primary Examiner* — Yuzhen Shen
(74) *Attorney, Agent, or Firm* — Robinson Intellectual Property Law Office; Eric J. Robinson

(57) ABSTRACT

A light-emitting device in which variation in luminance of pixels is suppressed. A light-emitting device includes at least a transistor, a first wiring, a second wiring, a first switch, a second switch, a third switch, a fourth switch, a capacitor, and a light-emitting element. The first wiring and a first electrode of the capacitor are electrically connected to each other through the first switch. A second electrode of the capacitor is connected to a first terminal of the transistor. The second wiring and a gate of the transistor are electrically connected to each other through the second switch. The first electrode of the capacitor and the gate of the transistor are electrically connected to each other through the third switch. The first terminal of the transistor and an anode of the light-emitting element are electrically connected to each other through the fourth switch.

10 Claims, 18 Drawing Sheets

(51) Int. Cl.
*H01L 27/12* (2006.01)
*G09G 3/3291* (2016.01)

(52) U.S. Cl.
CPC .............. *G09G 2300/0819* (2013.01); *G09G 2300/0842* (2013.01); *G09G 2300/0861* (2013.01); *G09G 2310/0262* (2013.01); *G09G 2320/0233* (2013.01); *G09G 2320/045* (2013.01)

(56) References Cited

U.S. PATENT DOCUMENTS

| | | |
|---|---|---|
| 5,744,864 A | 4/1998 | Cillessen et al. |
| 5,956,011 A | 9/1999 | Koyama et al. |
| 6,037,924 A | 3/2000 | Koyama et al. |
| 6,294,274 B1 | 9/2001 | Kawazoe et al. |
| 6,310,598 B1 | 10/2001 | Koyama et al. |
| 6,563,174 B2 | 5/2003 | Kawasaki et al. |
| 6,608,613 B2 | 8/2003 | Koyama et al. |
| 6,693,383 B2 | 2/2004 | Bae et al. |
| 6,727,522 B1 | 4/2004 | Kawasaki et al. |
| 6,737,813 B2 | 5/2004 | Kawasaki et al. |
| 6,839,057 B2 | 1/2005 | Iguchi |
| 6,928,136 B2 | 8/2005 | Nagao et al. |
| 6,958,750 B2 | 10/2005 | Azami et al. |
| 6,975,142 B2 | 12/2005 | Azami et al. |
| 7,042,426 B2 | 5/2006 | Shin |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,068,076 B2 | 6/2006 | Azami |
| 7,105,868 B2 | 9/2006 | Nause et al. |
| 7,129,917 B2 | 10/2006 | Yamazaki et al. |
| 7,133,012 B2 | 11/2006 | Abe |
| 7,151,278 B2 | 12/2006 | Nagao et al. |
| 7,173,590 B2 | 2/2007 | Uchino et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,317,429 B2 | 1/2008 | Shirasaki et al. |
| 7,323,356 B2 | 1/2008 | Hosono et al. |
| 7,327,357 B2 | 2/2008 | Jeong |
| 7,365,742 B2 | 4/2008 | Kim et al. |
| 7,382,342 B2 | 6/2008 | Uchino et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,443,367 B2 | 10/2008 | Numao |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,502,001 B2 | 3/2009 | Fish et al. |
| 7,532,209 B2 | 5/2009 | Kimura |
| 7,626,199 B2 | 12/2009 | Kim |
| 7,671,826 B2 | 3/2010 | Kimura |
| 7,674,650 B2 | 3/2010 | Akimoto et al. |
| 7,714,813 B2 | 5/2010 | Uchino et al. |
| 7,714,815 B2 | 5/2010 | Kim et al. |
| 7,732,819 B2 | 6/2010 | Akimoto et al. |
| 7,738,014 B2 | 6/2010 | Kwak et al. |
| 7,817,117 B2 | 10/2010 | Kimura |
| 7,982,696 B2 | 7/2011 | Kimura |
| 7,986,287 B2 | 7/2011 | Umezaki et al. |
| 7,989,815 B2 | 8/2011 | Yamazaki et al. |
| 8,049,743 B2 | 11/2011 | Kang |
| 8,159,424 B2 | 4/2012 | Yamamoto et al. |
| 8,164,547 B2 | 4/2012 | Kimura |
| 8,243,055 B2 | 8/2012 | Abe |
| 8,264,430 B2 | 9/2012 | Kimura |
| 8,334,540 B2 | 12/2012 | Yamazaki et al. |
| 8,674,371 B2 | 3/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0195968 A1* | 12/2002 | Sanford et al. ............ 315/169.3 |
| 2003/0090481 A1 | 5/2003 | Kimura |
| 2003/0117352 A1 | 6/2003 | Kimura |
| 2003/0132931 A1 | 7/2003 | Kimura et al. |
| 2003/0137503 A1 | 7/2003 | Kimura et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0080474 A1 | 4/2004 | Kimura |
| 2004/0095305 A1 | 5/2004 | Kimura et al. |
| 2004/0127038 A1 | 7/2004 | Carcia et al. |
| 2004/0174349 A1 | 9/2004 | Libsch et al. |
| 2004/0174354 A1* | 9/2004 | Ono et al. .................... 345/204 |
| 2005/0017302 A1 | 1/2005 | Hoffman |
| 2005/0199959 A1 | 9/2005 | Chiang et al. |
| 2005/0243079 A1 | 11/2005 | Ozaki |
| 2006/0028407 A1* | 2/2006 | Chou ............................ 345/76 |
| 2006/0035452 A1 | 2/2006 | Carcia et al. |
| 2006/0043377 A1 | 3/2006 | Hoffman et al. |
| 2006/0077194 A1* | 4/2006 | Jeong ............................ 345/204 |
| 2006/0082528 A1 | 4/2006 | Guo et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0109225 A1 | 5/2006 | Haga et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0170628 A1 | 8/2006 | Yamashita et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0290613 A1 | 12/2006 | Hong et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0103419 A1 | 5/2007 | Uchino et al. |
| 2007/0108446 A1 | 5/2007 | Akimoto |
| 2007/0120810 A1 | 5/2007 | You et al. |
| 2007/0126664 A1 | 6/2007 | Kimura |
| 2007/0126665 A1* | 6/2007 | Kimura ........................ 345/76 |
| 2007/0132694 A1 | 6/2007 | Uchino et al. |
| 2007/0139311 A1* | 6/2007 | Cho et al. ...................... 345/76 |
| 2007/0152217 A1 | 7/2007 | Lai et al. |
| 2007/0164962 A1 | 7/2007 | Uchino et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236424 A1 | 10/2007 | Kimura |
| 2007/0252928 A1 | 11/2007 | Ito et al. |
| 2007/0272922 A1 | 11/2007 | Kim et al. |
| 2007/0279403 A1 | 12/2007 | Uchino et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |

(56) References Cited

U.S. PATENT DOCUMENTS

| | | |
|---|---|---|
| 2008/0225061 A1 | 9/2008 | Kimura et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0278425 A1 | 11/2008 | Koyama |
| 2008/0296568 A1 | 12/2008 | Ryu et al. |
| 2009/0051674 A1 | 2/2009 | Kimura et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140981 A1 | 6/2009 | Kwak et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0001983 A1 | 1/2010 | Abe |
| 2010/0039458 A1* | 2/2010 | Nathan et al. ............... 345/698 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0149160 A1 | 6/2010 | Kimura |
| 2011/0024760 A1 | 2/2011 | Kimura |
| 2011/0050659 A1* | 3/2011 | Tsai et al. .................... 345/205 |
| 2011/0122325 A1 | 5/2011 | Yamashita et al. |
| 2011/0260170 A1 | 10/2011 | Kimura |
| 2013/0021228 A1* | 1/2013 | Miwa et al. .................. 345/76 |

FOREIGN PATENT DOCUMENTS

| | | |
|---|---|---|
| CN | 101563720 A | 10/2009 |
| EP | 1646032 A | 4/2006 |
| EP | 1737044 A | 12/2006 |
| EP | 1459126 | 1/2007 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-195810 A | 7/2003 |
| JP | 2004-103957 A | 4/2004 |
| JP | 2004-273614 A | 9/2004 |
| JP | 2004-273732 A | 9/2004 |
| JP | 2005-189643 A | 7/2005 |
| JP | 2005-195756 A | 7/2005 |
| JP | 2006-113586 A | 4/2006 |
| JP | 2006-215275 A | 8/2006 |
| JP | 2007-179042 A | 7/2007 |
| JP | 2008-176287 A | 7/2008 |
| JP | 2009-271333 A | 11/2009 |
| JP | 2010-039118 A | 2/2010 |
| JP | 2010-224033 A | 10/2010 |
| JP | 2011-112724 A | 6/2011 |
| JP | 2011-118079 A | 6/2011 |
| KR | 2008-0080608 A | 9/2008 |
| TW | 201030923 | 8/2010 |
| WO | WO-03/058328 | 7/2003 |
| WO | WO-2004/114391 | 12/2004 |
| WO | WO-2007/063814 | 6/2007 |
| WO | WO2008/075697 | 6/2008 |
| WO | WO-2010/038819 | 4/2010 |
| WO | WO-2011/068773 | 6/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

(56) References Cited

OTHER PUBLICATIONS

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, May 20, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

(56) References Cited

OTHER PUBLICATIONS

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2012/067244) dated Oct. 2, 2012.

Written Opinion (Application No. PCT/JP2012/067244) dated Oct. 2, 2012.

Taiwanese Office Action (Application No. 101126052) dated Jan. 25, 2016.

Chinese Office Action (Application No. 201280036250.X) dated Sep. 6, 2015.

\* cited by examiner

● In
○ Sn
○ Zn
• O

- In
- Ga
- Zn
- O

LIGHT-EMITTING DEVICE INCLUDING PIXELS SUPPRESSING VARIATION IN LUMINANCE

TECHNICAL FIELD

The present invention relates to a light-emitting device in which a transistor is provided in each pixel.

BACKGROUND ART

Since display devices using light-emitting elements have high visibility, are suitable for reduction in thickness, and do not have limitations on viewing angles, they have attracted attention as display devices that supersede cathode ray tubes (CRTs) and liquid crystal display devices. Specifically proposed structures of active matrix display devices using light-emitting elements are different depending on manufacturers. In general, a pixel includes at least a light-emitting element, a transistor that controls input of video signals to the pixel (a switching transistor), and a transistor that controls the amount of current supplied to the light-emitting element (a driving transistor).

When all the transistors in pixels have the same polarity, it is possible to omit some of the steps for fabricating the transistors, for example, a step of adding an impurity element imparting one conductivity type to a semiconductor film. Patent Document 1 discloses a light-emitting element type display in which transistors included in pixels are all n-channel transistors.

REFERENCE

Patent Document 1: Japanese Published Patent Application No. 2003-195810

DISCLOSURE OF INVENTION

In a light-emitting device, drain current of a driving transistor is supplied to a light-emitting element; thus, when the threshold voltages of driving transistors vary among pixels, the luminances of light-emitting elements vary accordingly. Therefore, in order to improve the image quality of a light-emitting device, it is important to propose a pixel configuration in which a current value of a driving transistor can be compensated in anticipation of variation in threshold voltage.

In general, a surface of a conductive film used as an anode of a light-emitting element is less likely to be oxidized in the air than that of a conductive film used as a cathode of a light-emitting element. In addition, since a conductive film used as an anode of a light-emitting element is generally formed by sputtering, when the anode is formed over an EL layer containing a light-emitting material, the EL layer tends to be damaged by sputtering. In view of the above, a light-emitting element in which an anode, an EL layer, and a cathode are stacked in this order can be fabricated through a simple process and can easily achieve high emission efficiency. However, when an n-channel driving transistor is used in combination with the above light-emitting element, a source of the driving transistor is connected to the anode of the light-emitting element. In that case, when the voltage between the anode and the cathode of the light-emitting element is increased owing to deterioration of the light-emitting material, the potential of the source of the driving transistor is increased, whereby the voltage between a gate and the source (gate voltage) of the driving transistor is decreased. Accordingly, the drain current of the driving transistor, that is, a current supplied to the light-emitting element is decreased, resulting in a decrease in luminance of the light-emitting element.

In view of the foregoing technical background, an object of one embodiment of the present invention is to provide a light-emitting device in which variation in luminance of pixels caused by variation in threshold voltage of driving transistors is suppressed. Another object of one embodiment of the present invention is to provide a light-emitting device in which a decrease in luminance of a light-emitting element caused by deterioration of an EL layer is suppressed.

A light-emitting device according to one embodiment of the present invention includes at least a transistor, a first wiring, a second wiring, a first switch, a second switch, a third switch, a fourth switch, a capacitor, and a light-emitting element. The first switch has a function of determining whether electrical continuity is established between the first wiring and one of a pair of electrodes of the capacitor. The other of the pair of electrodes of the capacitor is connected to one of a source and a drain of the transistor. The second switch has a function of determining whether electrical continuity is established between the second wiring and a gate of the transistor. The third switch has a function of determining whether electrical continuity is established between one of the pair of electrodes of the capacitor and the gate of the transistor. The fourth switch has a function of determining whether electrical continuity is established between one of the source and the drain of the transistor and an anode of the light-emitting element.

A light-emitting device according to another embodiment of the present invention includes at least a transistor, a first wiring, a second wiring, a third wiring, a first switch, a second switch, a third switch, a fourth switch, a capacitor, and a light-emitting element. The first switch has a function of determining whether electrical continuity is established between the first wiring and one of a pair of electrodes of the capacitor. The other of the pair of electrodes of the capacitor is connected to one of a source and a drain of the transistor and an anode of the light-emitting element. The second switch has a function of determining whether electrical continuity is established between the second wiring and a gate of the transistor. The third switch has a function of determining whether electrical continuity is established between the one of the pair of electrodes of the capacitor and the gate of the transistor. The fourth switch has a function of determining whether electrical continuity is established between the one of the source and the drain of the transistor and the third wiring.

Note that the switch is an element having a function of controlling supply of current or potential, and can be an electrical switch or a mechanical switch, for example. Specifically, the switch may be a transistor, a diode, or a logic circuit composed of transistors.

In the light-emitting device according to one embodiment of the present invention, with the above-described configuration, a potential that is higher than the threshold voltage of the driving transistor and lower than a voltage that is the sum of the threshold voltage and the voltage between the source and the drain of the driving transistor can be applied between the gate and the source of the driving transistor. When the source of the driving transistor is made floating while the above voltage is applied, the threshold voltage can be obtained between the gate and the source of the driving transistor. Then, when the voltage of an image signal is applied to the gate while the source is kept floating, a voltage that is the sum of the voltage of the image signal and the threshold voltage is applied between the gate and the source of the driving transistor. The light-emitting element is supplied with a current corresponding to the gate voltage of the driving transistor and expresses gradation accordingly.

In the light-emitting device according to one embodiment of the present invention, a potential that is the sum of the voltage of an image signal and the threshold voltage of the transistor can be applied to the gate electrode of the transistor; consequently, compensation of the threshold voltage and compensation of the potential of the anode can increase the image quality of the light-emitting device.

BEST MODE FOR CARRYING OUT THE INVENTION

Embodiments of the present invention will be hereinafter described in detail with reference to the accompanying drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that a light-emitting device in this specification includes, in its category, a panel in which a light-emitting element is formed in each pixel and a module in which an IC or the like including a controller is mounted on the panel. (Embodiment 1)

Figure 1A:
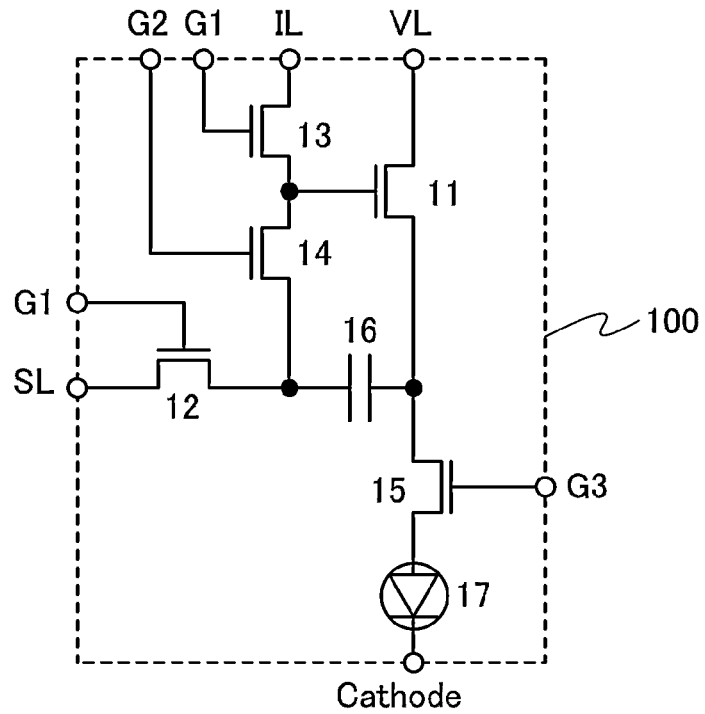
FIGS. 1A and 1B are circuit diagrams of pixels.

FIG. 1A illustrates an example of the configuration of a pixel 100 included in a light-emitting device according to one embodiment of the present invention.

The pixel 100 includes transistors 11 to 15, a capacitor 16, and a light-emitting element 17. FIG. 1A shows the case where the transistors 11 to 15 are n-channel transistors.

The transistor 12 has a function of determining whether electrical continuity is established between a wiring SL and one of a pair of electrodes of the capacitor 16. The other of the pair of electrodes of the capacitor 16 is connected to one of a source and a drain of the transistor 11. The transistor 13 has a function of determining whether electrical continuity is established between a wiring IL and a gate of the transistor 11. The transistor 14 has a function of determining whether electrical continuity is established between one of the pair of electrodes of the capacitor 16 and the gate of the transistor 11. The transistor 15 has a function of determining whether electrical continuity is established between one of the source and the drain of the transistor 11 and an anode of the light-emitting element 17.

In FIG. 1A, the other of the source and the drain of the transistor 11 is connected to a wiring VL.

The on/off state of the transistor 12 is determined by the potential of a wiring G1 connected to a gate of the transistor 12. The on/off state of the transistor 13 is determined by the potential of the wiring G1 connected to a gate of the transistor 13. The on/off state of the transistor 14 is determined by the potential of a wiring G2 connected to a gate of the transistor 14. The on/off state of the transistor 15 is determined by the potential of a wiring G3 connected to a gate of the transistor 15.

Note that in this specification, the term "connection" means electrical connection and corresponds to a state in which current, voltage, or a potential can be supplied or transmitted. Therefore, a state of connection means not only a state of direct connection but also a state of indirect connection through an element such as a wiring, a conductive film, a resistor, a diode, or a transistor, in which current, voltage, or a potential can be supplied or transmitted.

Even when different components are connected to each other in a circuit diagram, there is actually a case where one conductive film has functions of a plurality of components, such as a case where part of a wiring serves as an electrode. The term "connection" in this specification also includes in its category such a case where one conductive film has functions of a plurality of components.

The light-emitting element 17 includes the anode, a cathode, and an EL layer provided between the anode and the cathode. The EL layer is formed using a single layer or plural layers, at least one of which is a light-emitting layer containing a light-emitting substance. From the EL layer, electroluminescence is obtained by current supplied when a potential difference between the cathode and the anode, using the potential of the cathode as a reference potential, is higher than or equal to a threshold voltage Vthe of the light-emitting element 17. As electroluminescence, there are luminescence (fluorescence) at the time of returning from a singlet-excited state to a ground state and luminescence (phosphorescence) at the time of returning from a triplet-excited state to a ground state.

Note that the terms "source" and "drain" of a transistor interchange with each other depending on the polarity of the transistor or the levels of potentials applied to the source and the drain. In general, in an n-channel transistor, one to which a lower potential is applied is called a source, and one to which a higher potential is applied is called a drain. In a p-channel transistor, one to which a lower potential is supplied is called a drain, and one to which a higher potential is supplied is called a source. In this specification, although the connection relation of the transistor is sometimes described assuming that the source and the drain are fixed for convenience, actually, the names of the source and the drain may interchange with each other depending on the relation of the potentials.

Figure 1B:
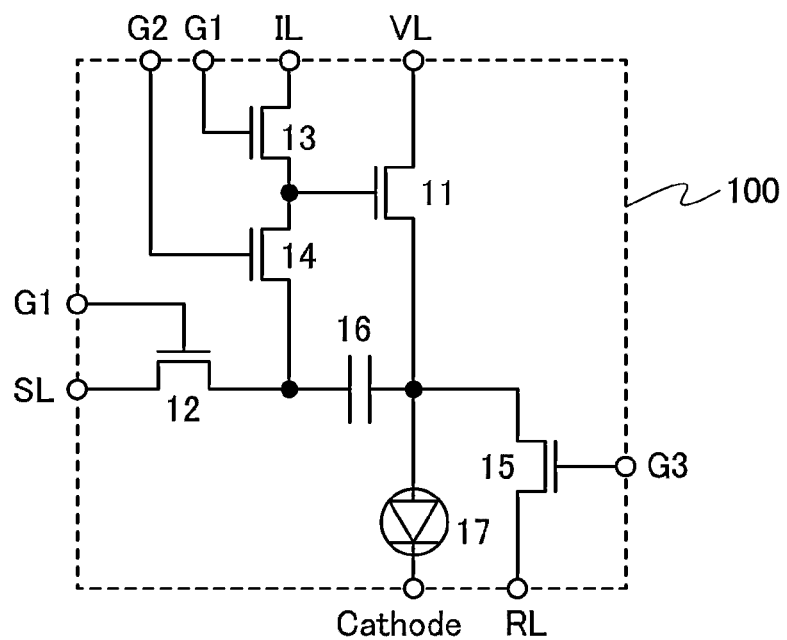

FIG. 1B illustrates another example of the pixel 100 included in the light-emitting device according to one embodiment of the present invention.

The pixel 100 includes the transistors 11 to 15, the capacitor 16, and the light-emitting element 17. FIG. 1B shows the case where the transistors 11 to 15 are n-channel transistors.

The transistor 12 has a function of determining whether electrical continuity is established between the wiring SL and one of the pair of electrodes of the capacitor 16. The other of the pair of electrodes of the capacitor 16 is connected to one of the source and the drain of the transistor 11 and the anode of the light-emitting element 17. The transistor 13 has a function of determining whether electrical continuity is established between the wiring IL and the gate of the transistor 11. The transistor 14 has a function of determining whether electrical continuity is established between one of the pair of electrodes of the capacitor 16 and the gate of the transistor 11. The transistor 15 has a function of determining whether electrical continuity is established between one of the source and the drain of the transistor 11 and a wiring RL and between the anode of the light-emitting element 17 and the wiring RL. The other of the source and the drain of the transistor 11 is connected to the wiring VL.

The on/off state of the transistor 12 is determined by the potential of the wiring G1 connected to the gate of the transistor 12. The on/off state of the transistor 13 is determined by the potential of the wiring G1 connected to the gate of the transistor 13. The on/off state of the transistor 14 is determined by the potential of the wiring G2 connected to the gate of the transistor 14. The on/off state of the transistor 15 is determined by the potential of the wiring G3 connected to the gate of the transistor 15.

In FIGS. 1A and 1B, the transistors 11 to 15 each have the gate placed on at least one side of a semiconductor film; alternatively, the transistors 11 to 15 may have a pair of gates between which the semiconductor film is sandwiched. When one of the pair of gates and the other one of the pair of gates are regarded as a front gate and a back gate, respectively, the back gate may be floating or may be externally supplied with a potential. In the latter case, potentials at the same level may be applied to the front gate and the back gate, or a fixed potential such as a ground potential may be applied only to the back gate. By controlling the level of the potential applied to the back gate, the threshold voltage of the transistor can be controlled. By providing the back gate, a channel formation region is enlarged and the drain current can be increased. Moreover, providing the back gate facilitates formation of a depletion layer in the semiconductor film, which results in lower subthreshold swing.

FIGS. 1A and 1B each show the case where the transistors 11 to 15 are n-channel transistors. When the transistors 11 to 15 have the same polarity, it is possible to omit some of steps for fabricating the transistors, for example, a step of adding an impurity element imparting one conductivity type to the semiconductor film. Note that in the light-emitting device according to one embodiment of the present invention, not all the transistors 11 to 15 are necessarily n-channel transistors. At least the transistor 11 is preferably an n-channel transistor when the anode of the light-emitting element 17 is connected to one of a source and a drain of the transistor 15, whereas at least the transistor 11 is preferably a p-channel transistor when the cathode of the light-emitting element 17 is connected to one of the source and the drain of the transistor 15.

In the case where the transistor 11 operates in a saturation region to pass a current therethrough, its channel length or channel width is preferably larger than those of the transistors 12 to 15. The increase in the channel length or channel width may make the drain current in the saturation region constant, thereby reducing the kink effect. Alternatively, the increase in the channel length or channel width allows a large amount of current to flow through the transistor 11 even in the saturation region.

FIGS. 1A and 1B each illustrate that the transistors 11 to 15 have a single-gate structure including one gate and one channel formation region; however, the transistor in the present invention is not limited to a single-gate transistor. Any or all of the transistors 11 to 15 may have a multi-gate structure including a plurality of gates electrically connected to each other and a plurality of channel formation regions.

Next, the operation of the pixel 100 illustrated in FIG. 1A will be described.

Figure 2:
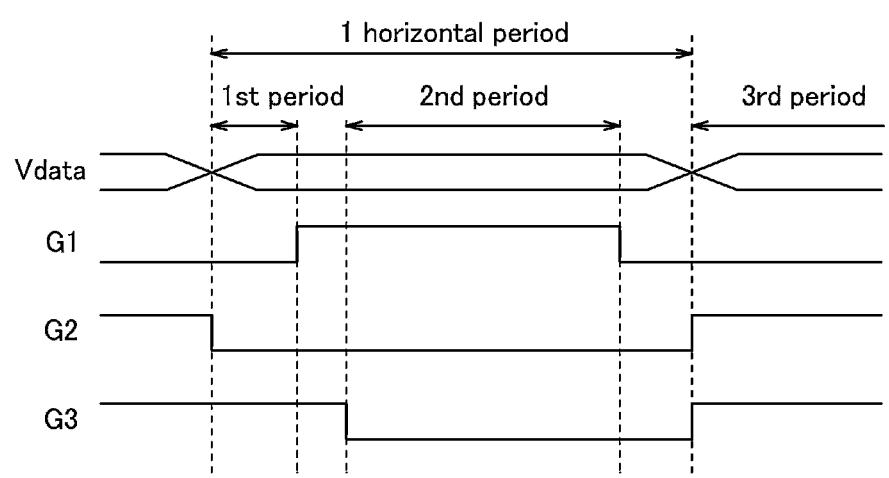
FIG. 2 is a timing chart illustrating the operation of a pixel.

FIG. 2 is an example of a timing chart showing the potentials of the wirings G1 to G3 and a potential Vdata supplied to the wiring SL; the wirings G1 to G3 and the wiring SL are connected to the pixel 100 in FIG. 1A. Note that the timing chart in FIG. 2 illustrates the case where the transistors 11 to 15 are n-channel transistors. As illustrated in FIG. 2, the operation of the pixel 100 in FIG. 1A can be mainly divided into a first operation in a first period, a second operation in a second period, and a third operation in a third period.

First, the first operation in the first period is described. In the first period, a low-level potential is applied to the wiring G1, a low-level potential is applied to the wiring G2, and a high-level potential is applied to the wiring G3. As a result, the transistor 15 is turned on, and the transistors 12 to 14 are turned off.

A potential Vano is applied to the wiring VL, and a potential Vcat is applied to the cathode of the light-emitting element 17. The potential Vano is higher than a potential that is the sum of the threshold voltage Vthe of the light-emitting element 17 and the potential Vcat. The threshold voltage Vthe of the light-emitting element 17 is hereinafter assumed to be 0.

Figure 3A:
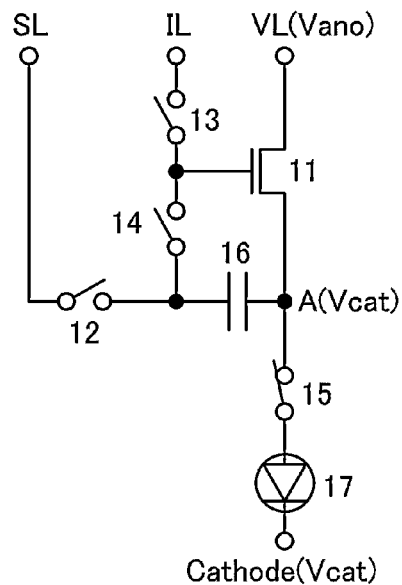
FIGS. 3A to 3C illustrate the operation of a pixel.

FIG. 3A illustrates the operation of the pixel 100 in the first period. In FIG. 3A, the transistors 12 to 15 are represented as switches. In the first period, by the above operation, the potential of one of the source and the drain of the transistor 11 (illustrated as a node A) becomes the potential which is the sum of the potential Vcat and the threshold voltage Vthe of the light-emitting element 17. In FIG. 3A, the potential of the node A becomes the potential Vcat because the threshold voltage Vthe is assumed to be 0.

Next, the second operation in the second period is described. In the second period, a high-level potential is applied to the wiring G1, a low-level potential is applied to the wiring G2, and a low-level potential is applied to the wiring G3. As a result, the transistors 12 and 13 are turned on, the transistor 14 remains off, and the transistor 15 is turned off.

During the transition from the first period to the second period, it is preferable that the potential applied to the wiring G3 be switched from a high-level potential to a low-level potential after the potential applied to the wiring G1 is switched from a low-level potential to a high-level potential, in which case the potential of the node A can be prevented from being changed by switching of the potential applied to the wiring G1.

The potential Vano is applied to the wiring VL, and the potential Vcat is applied to the cathode of the light-emitting element 17. A potential V0 is applied to the wiring IL, and the potential Vdata of an image signal is applied to the wiring SL. Note that the potential V0 is preferably higher than a potential that is the sum of the potential Vcat, a threshold voltage Vth of the transistor 11, and the threshold voltage Vthe of the light-emitting element 17 and is preferably lower than a potential that is the sum of the potential Vano and the threshold voltage Vth of the transistor 11.

Figure 3B:
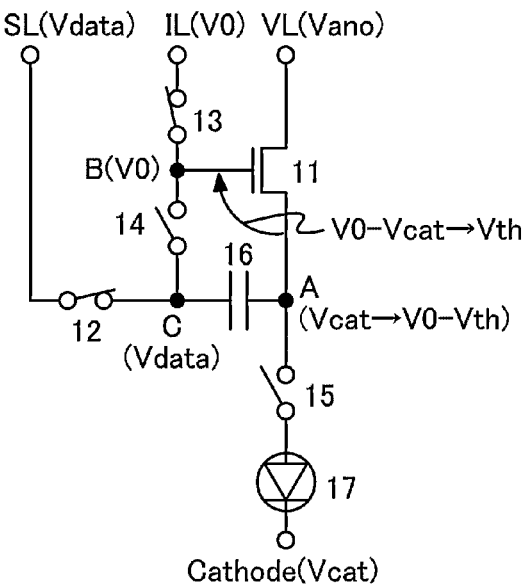

FIG. 3B illustrates the operation of the pixel 100 in the second period. In FIG. 3B, the transistors 12 to 15 are represented as switches. In the second period, the transistor 11 is turned on since the potential V0 is applied to the gate of the transistor 11 (illustrated as a node B) by the above operation. Thus, charge in the capacitor 16 is discharged through the transistor 11, and the potential of the node A, which is the potential Vcat, starts to rise. Then, when the potential of the node A finally reaches the potential V0−Vth, that is, when the gate voltage of the transistor 11 is decreased to the threshold voltage Vth, the transistor 11 is turned off. The potential Vdata is applied to one electrode of the capacitor 16 (illustrated as a node C).

Next, the third operation in the third period is described. In the third period, a low-level potential is applied to the wiring G1, a high-level potential is applied to the wiring G2, and a high-level potential is applied to the wiring G3. As a result, the transistors 14 and 15 are turned on, and the transistors 12 and 13 are turned off.

During the transition from the second period to the third period, it is preferable that the potentials applied to the wirings G2 and G3 be switched from a low-level potential to a high-level potential after the potential applied to the wiring G1 is switched from a high-level potential to a low-level potential, in which case the potential of the node A can be prevented from being changed by switching of the potential applied to the wiring G1.

The potential Vano is applied to the wiring VL, and the potential Vcat is applied to the cathode of the light-emitting element 17.

Figure 3C:
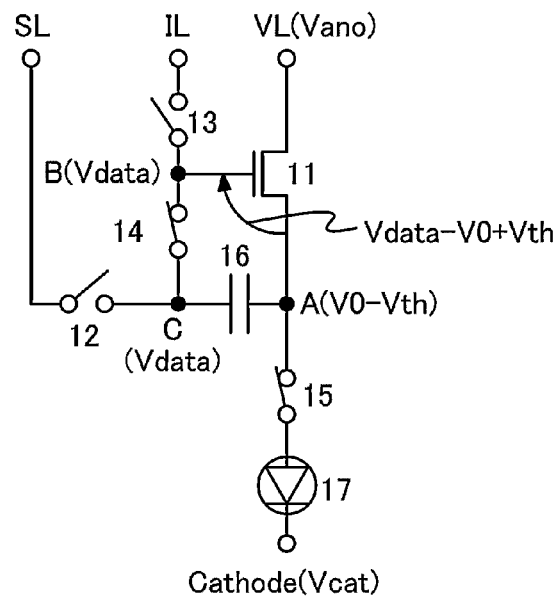

FIG. 3C illustrates the operation of the pixel 100 in the third period. In FIG. 3C, the transistors 12 to 15 are represented as switches. In the third period, the gate voltage of the transistor 11 becomes Vdata−V0+Vth since the potential Vdata is applied to the node B by the above operation. That is, the gate voltage of the transistor 11 can be the value to which the threshold voltage Vth is added. Consequently, variation in the threshold voltage Vth of the transistors 11 can be prevented from adversely affecting the value of a current supplied to the light-emitting elements 17. Alternatively, even if the transistor 11 deteriorates and the threshold voltage Vth is changed, the change in the threshold voltage Vth can be prevented from adversely affecting the value of a current supplied to the light-emitting element 17. Therefore, display unevenness can be reduced, and high-quality images can be displayed.

Next, the operation of the pixel 100 illustrated in FIG. 1B will be described.

Figure 4:
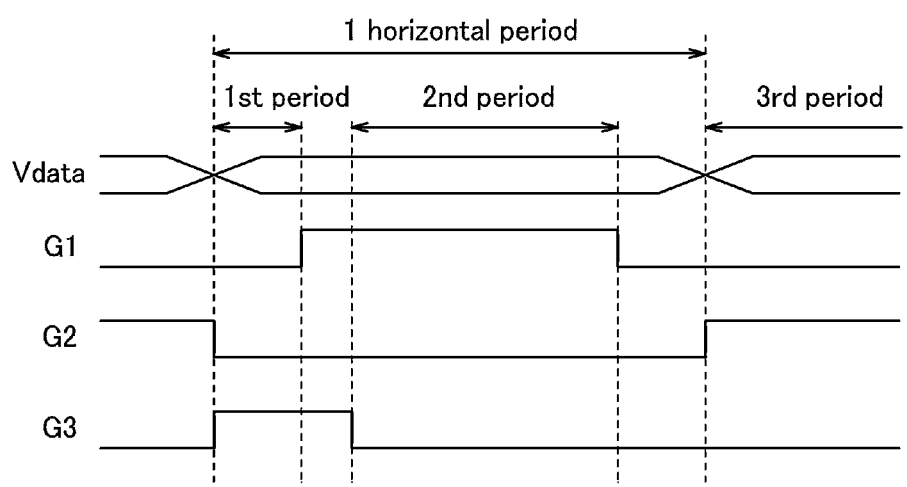
FIG. 4 is a timing chart illustrating the operation of a pixel.

FIG. 4 is an example of a timing chart showing the potentials of the wirings G1 to G3 and the potential Vdata supplied to the wiring SL; the wirings G1 to G3 and the wiring SL are connected to the pixel 100 in FIG. 1B. Note that the timing chart in FIG. 4 illustrates the case where the transistors 11 to 15 are n-channel transistors. As illustrated in FIG. 4, the operation of the pixel 100 in FIG. 1B can be mainly divided into a first operation in a first period, a second operation in a second period, and a third operation in a third period.

First, the first operation in the first period is described. In the first period, a low-level potential is applied to the wiring G1, a low-level potential is applied to the wiring G2, and a high-level potential is applied to the wiring G3. As a result, the transistor 15 is turned on, and the transistors 12 to 14 are turned off.

The potential Vano is applied to the wiring VL, and the potential Vcat is applied to the cathode of the light-emitting element 17. As described above, the potential Vano is higher than the potential which is the sum of the threshold voltage Vthe of the light-emitting element 17 and the potential Vcat. A potential V1 is applied to the wiring RL. The potential V1 is preferably lower than a potential that is the sum of the potential Vcat and the threshold voltage Vthe of the light-emitting element 17. With the potential V1 set in the above range, a current can be prevented from flowing through the light-emitting element 17 in the first period.

Figure 5A:
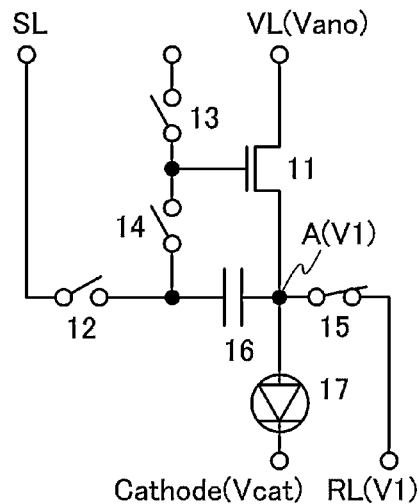
FIGS. 5A to 5C illustrate the operation of a pixel.

FIG. 5A illustrates the operation of the pixel 100 in the first period. In FIG. 5A, the transistors 12 to 15 are represented as switches. In the first period, the potential V1 is applied to one of the source and the drain of the transistor 11 (illustrated as the node A) by the above operation.

Next, the second operation in the second period is described. In the second period, a high-level potential is applied to the wiring G1, a low-level potential is applied to the wiring G2, and a low-level potential is applied to the wiring G3. As a result, the transistors 12 and 13 are turned on, the transistor 14 remains off, and the transistor 15 is turned off.

During the transition from the first period to the second period, it is preferable that the potential applied to the wiring G3 be switched from a high-level potential to a low-level potential after the potential applied to the wiring G1 is switched from a low-level potential to a high-level potential, in which case the potential of the node A can be prevented from being changed by switching of the potential applied to the wiring G1.

The potential Vano is applied to the wiring VL, and the potential Vcat is applied to the cathode of the light-emitting element 17. The potential V0 is applied to the wiring IL, and the potential Vdata of an image signal is applied to the wiring SL. As described above, the potential V0 is preferably higher than the potential which is the sum of the potential Vcat, the threshold voltage Vth of the transistor 11, and the threshold voltage Vthe of the light-emitting element 17 and is preferably lower than the potential which is the sum of the potential Vano and the threshold voltage Vth of the transistor 11. Note that unlike in the pixel 100 in FIG. 1A, the anode of the light-emitting element 17 is connected to one of the source and the drain of the transistor 11 in the pixel 100 in FIG. 1B. For that reason, the potential V0 in the pixel 100 in FIG. 1B is preferably set lower than that in the pixel 100 in FIG. 1A in order not to increase the value of current that is supplied to the light-emitting element 17 in the second period.

Figure 5B:
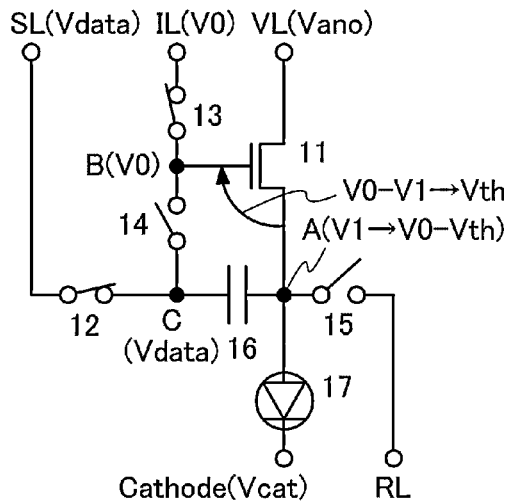

FIG. 5B illustrates the operation of the pixel 100 in the second period. In FIG. 5B, the transistors 12 to 15 are represented as switches. In the second period, the transistor 11 is turned on since the potential V0 is applied to the gate of the transistor 11 (illustrated as the node B) by the above operation. Thus, charge in the capacitor 16 is discharged through the transistor 11, and the potential of the node A, which is the potential V1, starts to rise. Then, when the potential of the node A finally reaches the potential V0−Vth, that is, when the gate voltage of the transistor 11 is decreased to the threshold voltage Vth, the transistor 11 is turned off. The potential Vdata is applied to one electrode of the capacitor 16 (illustrated as the node C).

Next, the third operation in the third period is described. In the third period, a low-level potential is applied to the wiring G1, a high-level potential is applied to the wiring G2, and a low-level potential is applied to the wiring G3. As a result, the transistor 14 is turned on, the transistors 12 and 13 are turned off, and the transistor 15 remains off.

During the transition from the second period to the third period, it is preferable that the potential applied to the wiring G2 be switched from a low-level potential to a high-level potential after the potential applied to the wiring G1 is switched from a high-level potential to a low-level potential, in which case the potential of the node A can be prevented from being changed by switching of the potential applied to the wiring G1.

The potential Vano is applied to the wiring VL, and the potential Vcat is applied to the cathode of the light-emitting element 17.

Figure 5C:
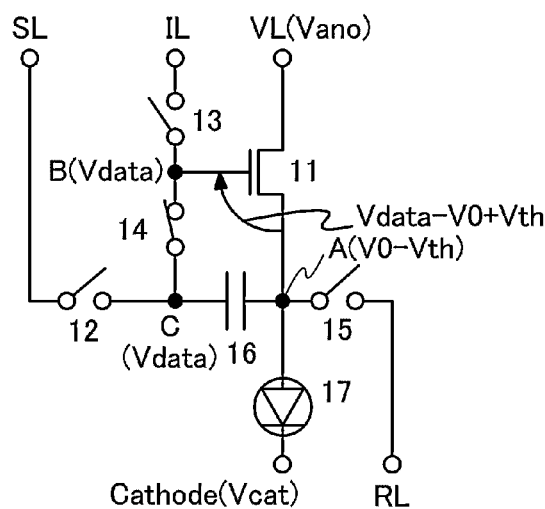

FIG. 5C illustrates the operation of the pixel 100 in the third period. In FIG. 5C, the transistors 12 to 15 are represented as switches. In the third period, the gate voltage of the transistor 11 becomes Vdata−V0+Vth since the potential Vdata is applied to the node B by the above operation. That is, the gate voltage of the transistor 11 can be the value to which the threshold voltage Vth is added. Consequently, variation in the threshold voltage Vth of the transistors 11 can be prevented from adversely affecting the value of a current supplied to the light-emitting elements 17. Alternatively, even if the transistor 11 deteriorates and the threshold voltage Vth is changed, the change in the threshold voltage Vth can be prevented from adversely affecting the value of a current supplied to the light-emitting element 17. Therefore, display unevenness can be reduced, and high-quality images can be displayed.

In the light-emitting element type display disclosed in Patent Document 1, a gate and a drain of a transistor (Tr12) for supplying current to an organic EL element are electrically connected to each other to obtain the threshold voltage. For that reason, when the transistor (Tr12) is a normally-on transistor, the potential of the source of the transistor (Tr12) is never higher than that of the gate. It is therefore difficult to obtain the threshold voltage when the transistor (Tr12) is a normally-on transistor.

In contrast, in the light-emitting device according to one embodiment of the present invention, which includes the pixel illustrated in FIG. 1A or FIG. 1B, the other of the source and the drain of the transistor 11 is electrically separated from the gate of the transistor 11, so that their potentials can be individually controlled. Accordingly, in the second operation, the potential of the other of the source and the drain of the transistor 11 can be set higher than a value that is the sum of the potential of the gate of the transistor 11 and the threshold voltage Vth. Therefore, when the transistor 11 is a normally-on transistor, that is, when the threshold voltage Vth is negative, charge can be accumulated in the capacitor 16 until the potential of the source of the transistor 11 becomes higher than the potential V0 of the gate of the transistor 11. Thus, in the light-emitting device according to one embodiment of the present invention, even when the transistor 11 is a normally-on transistor, the threshold voltage can be obtained in the second operation, and in the third operation, the gate voltage of the transistor 11 can be set at the value to which the threshold voltage Vth is added.

Therefore, in the light-emitting device according to one embodiment of the present invention, display unevenness can be reduced and high-quality images can be displayed even if the transistor 11 including a semiconductor film containing an oxide semiconductor, for example, becomes normally on.

(Embodiment 2)

Figure 6:
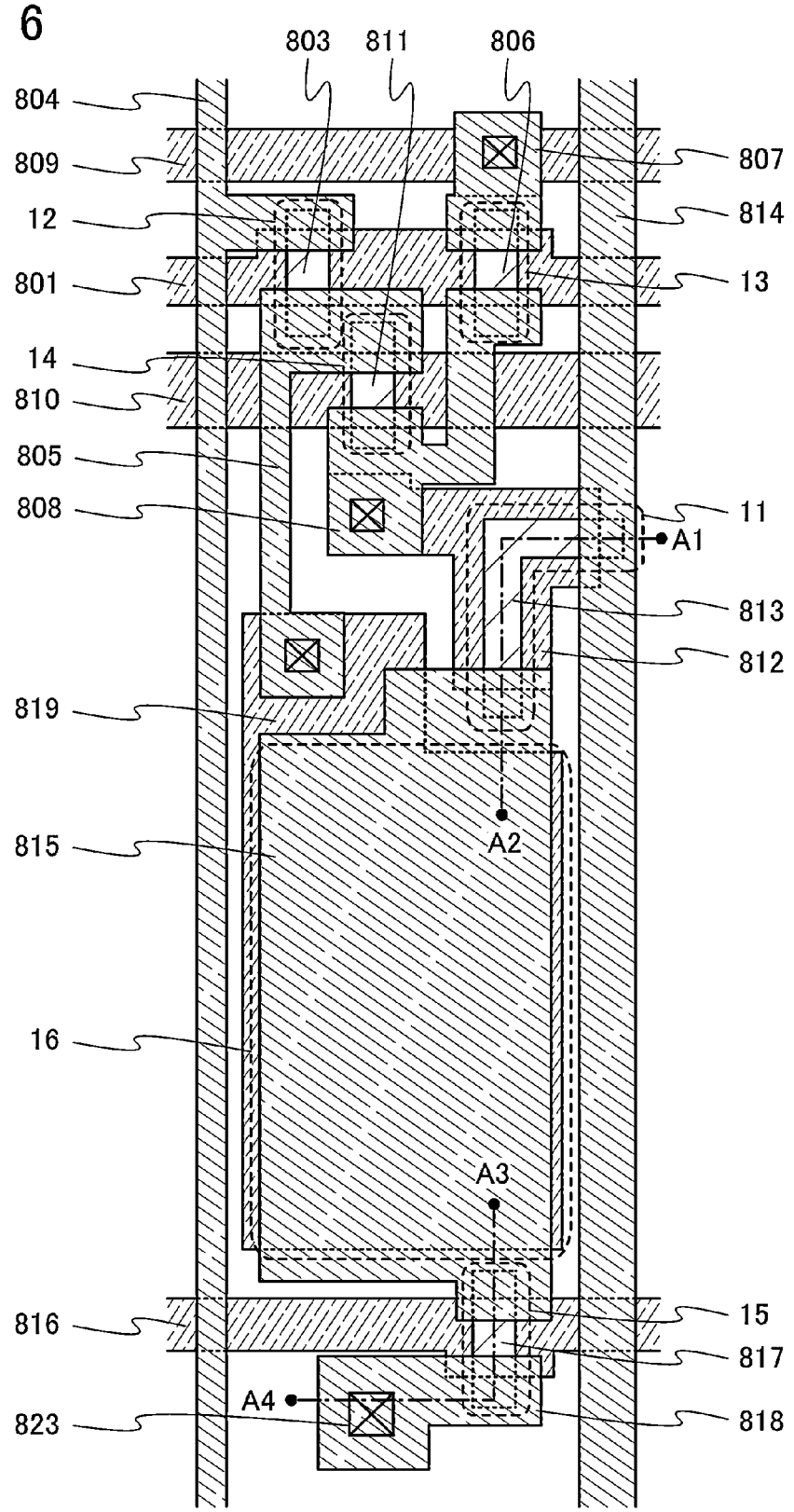
FIG. 6 is a top view of a pixel.

FIG. 6 illustrates an example of a top view of the pixel illustrated in FIG. 1A. Note that in the top view of the pixel in FIG. 6, insulating films are omitted in order to clearly show the layout of the pixel. Further, in the top view of the pixel in FIG. 6, the anode, the EL layer, and the cathode are omitted in order to clearly show the layout of the transistors and the capacitor included in the pixel.

Figure 7:
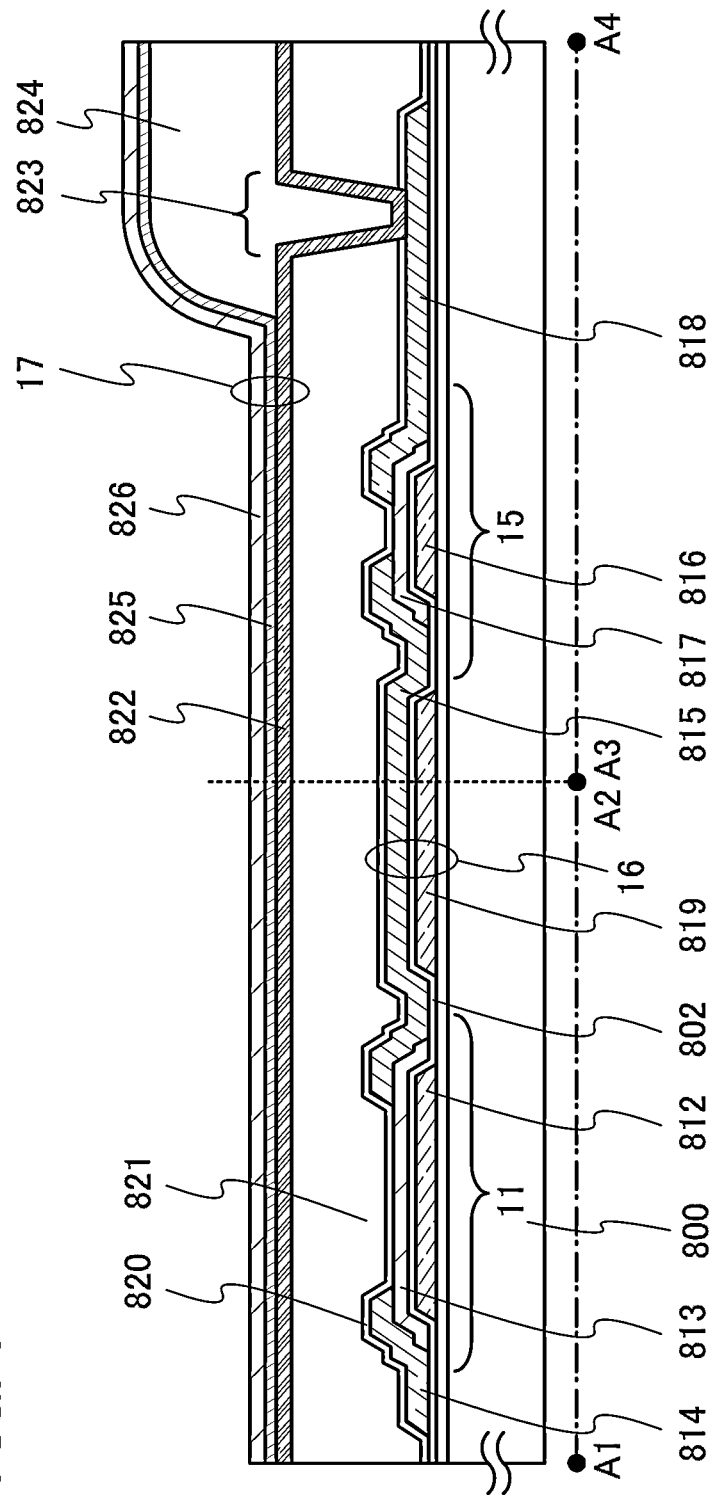
FIG. 7 is a cross-sectional view of a pixel.

FIG. 7 is a cross-sectional view along dashed lines A1-A2 and A3-A4 in the top view in FIG. 6.

The transistor 12 includes, over a substrate 800 having an insulating surface, a conductive film 801 functioning as a gate, a gate insulating film 802 over the conductive film 801, a semiconductor film 803 positioned over the gate insulating film 802 to overlap with the conductive film 801, and conductive films 804 and 805 that are positioned over the semiconductor film 803 and function as a source and a drain. The conductive film 801 also functions as the wiring G1. The conductive film 804 also functions as the wiring SL.

The transistor 13 includes, over the substrate 800 having an insulating surface, the conductive film 801 functioning as a gate, the gate insulating film 802 over the conductive film 801, a semiconductor film 806 positioned over the gate insulating film 802 to overlap with the conductive film 801, and conductive films 807 and 808 that are positioned over the semiconductor film 806 and function as a source and a drain. The conductive film 807 is connected to a conductive film 809 functioning as the wiring IL through a contact hole.

The transistor 14 includes, over the substrate 800 having an insulating surface, a conductive film 810 functioning as a gate, the gate insulating film 802 over the conductive film 810, a semiconductor film 811 positioned over the gate insulating film 802 to overlap with the conductive film 810, and the conductive films 805 and 808 that are positioned over the semiconductor film 811 and function as a source and a drain. The conductive film 810 also functions as the wiring G2.

The transistor 11 includes, over the substrate 800 having an insulating surface, a conductive film 812 functioning as a gate, the gate insulating film 802 over the conductive film 812, a semiconductor film 813 positioned over the gate insulating film 802 to overlap with the conductive film 812, and conductive films 814 and 815 that are positioned over the semiconductor film 813 and function as a source and a drain. The conductive film 812 is connected to the conductive film 808. The conductive film 814 also functions as the wiring VL.

The transistor 15 includes, over the substrate 800 having an insulating surface, a conductive film 816 functioning as a gate, the gate insulating film 802 over the conductive film 816, a semiconductor film 817 positioned over the gate insulating film 802 to overlap with the conductive film 816, and the conductive film 815 and a conductive film 818 that are positioned over the semiconductor film 817 and function as a source and a drain. The conductive film 816 also functions as the wiring G3.

The capacitor 16 includes, over the substrate 800 having an insulating surface, a conductive film 819, the gate insulating film 802 over the conductive film 819, and the conductive film 815 positioned over the gate insulating film 802 to overlap with the conductive film 819. The conductive film 819 is connected to the conductive film 805.

An insulating film 820 is formed over the conductive films 804, 805, 807, 808, 814, 815, and 818. A conductive film 822 functioning as an anode is formed over the insulating film 821. The conductive film 822 is connected to the conductive film 818 through a contact hole 823 formed in the insulating films 820 and 821.

An insulating film 824 having an opening where part of the conductive film 822 is exposed is provided over the insulating film 821. An EL layer 825 and a conductive film 826 functioning as a cathode are stacked in this order over the part of the conductive film 822 and the insulating film 824. A region where the conductive film 822, the EL layer 825, and the conductive film 826 overlap with one another corresponds to the light-emitting element 17.

Figure 8:
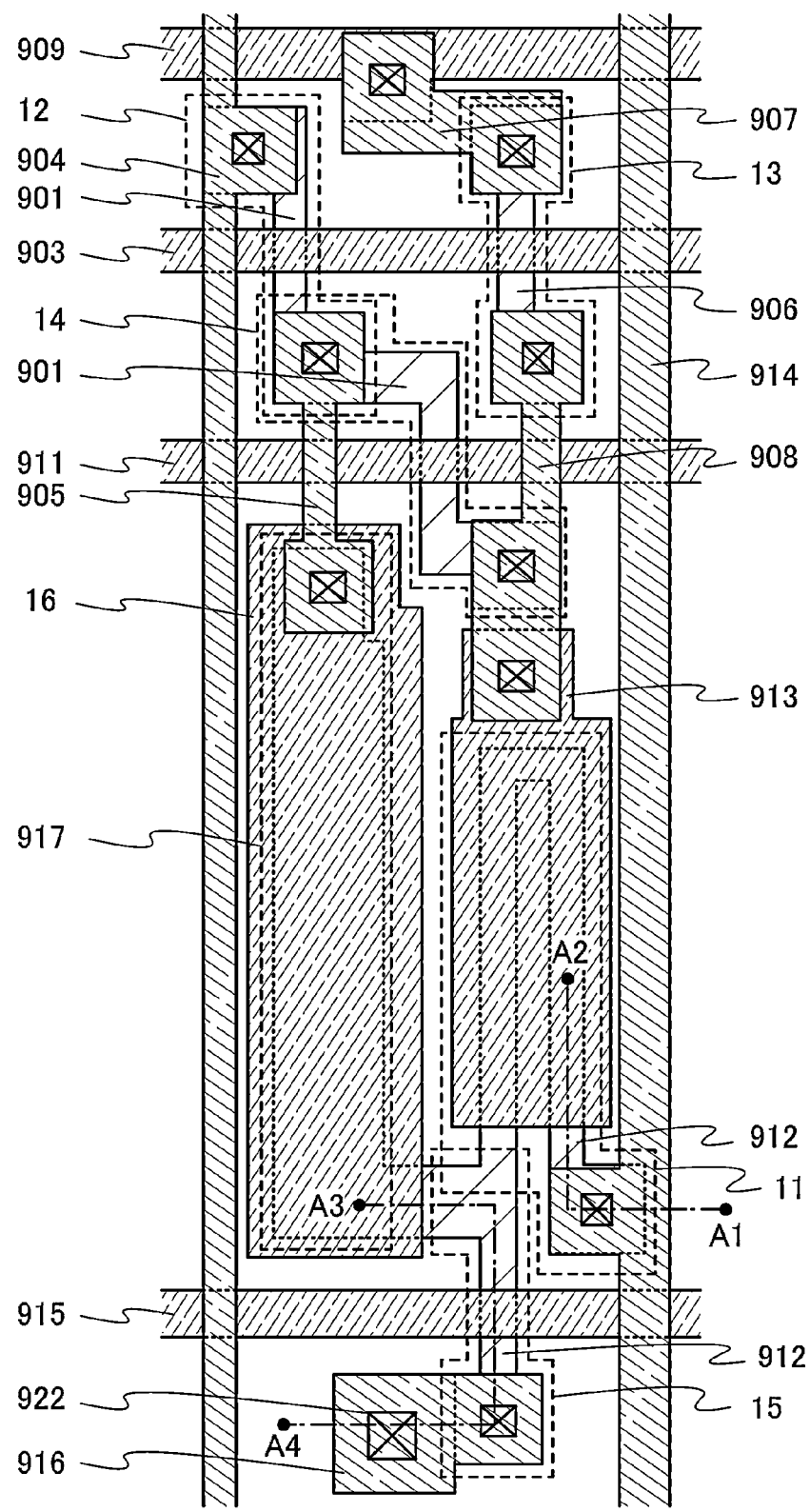
FIG. 8 is a top view of a pixel.

FIG. 8 illustrates another example of a top view of the pixel illustrated in FIG. 1A. Note that in the top view of the pixel in FIG. 8, insulating films are omitted in order to clearly show the layout of the pixel. Further, in the top view of the pixel in FIG. 8, the anode, the EL layer, and the cathode are omitted in order to clearly show the layout of the transistors and the capacitor included in the pixel.

Figure 9:
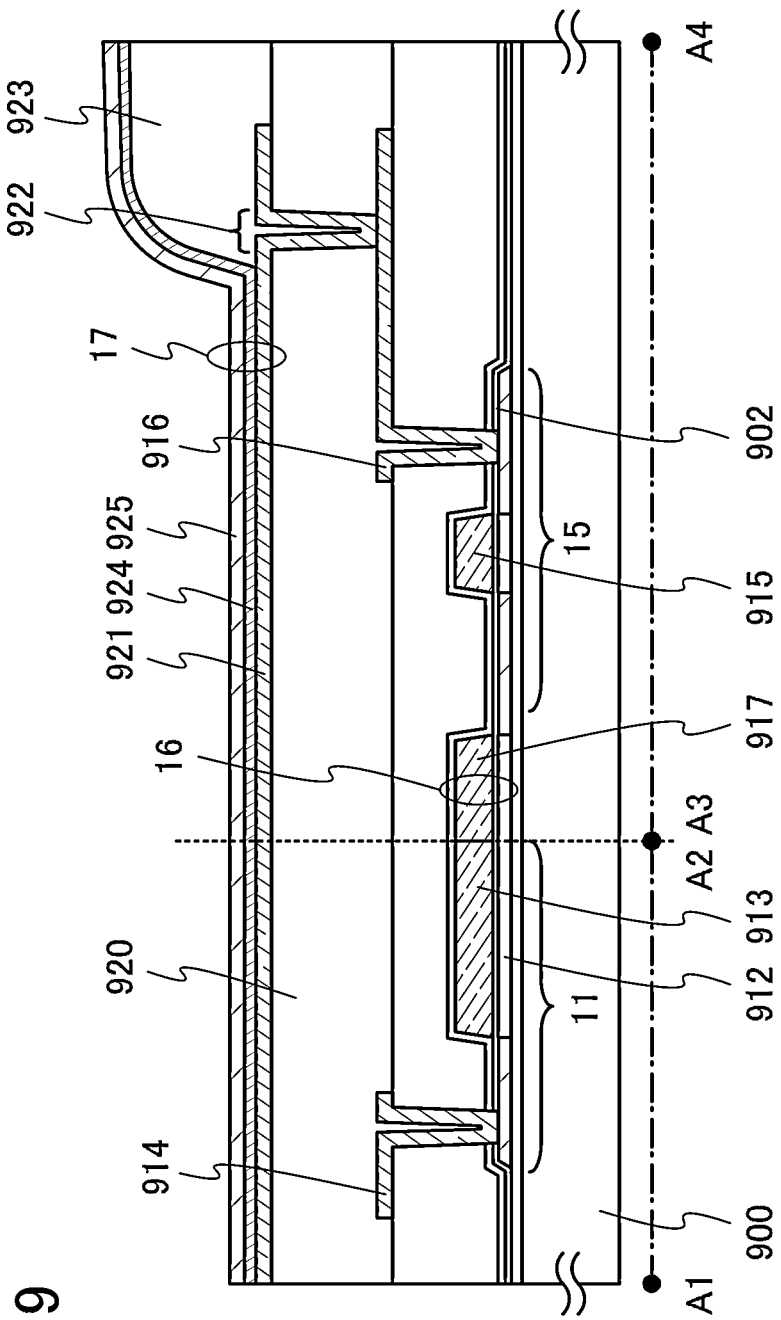
FIG. 9 is a cross-sectional view of a pixel.

FIG. 9 is a cross-sectional view along dashed lines A1-A2 and A3-A4 in the top view in FIG. 8.

The transistor 12 includes, over a substrate 900 having an insulating surface, a semiconductor film 901, a gate insulating film 902 over the semiconductor film 901, a conductive film 903 that is positioned over the gate insulating film 902 to overlap with the semiconductor film 901 and functions as a gate, and conductive films 904 and 905 connected to a source and a drain included in the semiconductor film 901. The conductive film 903 also functions as the wiring G1. The conductive film 904 also functions as the wiring SL.

The transistor 13 includes, over the substrate 900 having an insulating surface, a semiconductor film 906, the gate insulating film 902 over the semiconductor film 906, the conductive film 903 that is positioned over the gate insulating film 902 to overlap with the semiconductor film 906 and functions as a gate, and conductive films 907 and 908 connected to a source and a drain included in the semiconductor film 906. The conductive film 907 is connected to a conductive film 909 functioning as the wiring IL through a contact hole.

The transistor 14 includes, over the substrate 900 having an insulating surface, the semiconductor film 901, the gate insulating film 902 over the semiconductor film 901, a conductive film 911 that is positioned over the gate insulating film 902 to overlap with the semiconductor film 901 and functions as a gate, and the conductive films 905 and 908 connected to a source and a drain included in the semiconductor film 901. The conductive film 911 also functions as the wiring G2. Note that in FIG. 8, the transistors 12 and 14 share one semiconductor film 901; alternatively, the transistors 12 and 14 may include different semiconductor films.

The transistor 11 includes, over the substrate 900 having an insulating surface, a semiconductor film 912, the gate insulating film 902 over the semiconductor film 912, a conductive film 913 that is positioned over the gate insulating film 902 to overlap with the semiconductor film 912 and functions as a gate, and a conductive film 914 connected to a source or a drain included in the semiconductor film 912. The conductive film 913 is connected to the conductive film 908. The conductive film 914 also functions as the wiring VL.

The transistor 15 includes, over the substrate 900 having an insulating surface, the semiconductor film 912, the gate insulating film 902 over the semiconductor film 912, a conductive film 915 that is positioned over the gate insulating film 902 to overlap with the semiconductor film 912 and functions as a gate, and a conductive film 916 connected to a source or a drain included in the semiconductor film 912. The conductive film 915 also functions as the wiring G3.

The capacitor 16 includes, over the substrate 900 having an insulating surface, the semiconductor film 912, the gate insulating film 902 over the semiconductor film 912, and a conductive film 917 positioned over the gate insulating film 902 to overlap with the semiconductor film 912. The conductive film 917 is connected to the conductive film 905.

An insulating film 920 is formed over the conductive films 904, 905, 907, 908, 914, and 916. A conductive film 921 functioning as an anode is provided over the insulating film 920. The conductive film 921 is connected to the conductive film 916 through a contact hole 922 formed in the insulating film 920.

An insulating film 923 having an opening where part of the conductive film 921 is exposed is provided over the insulating film 920. An EL layer 924 and a conductive film 925 functioning as a cathode are stacked in this order over the part of the conductive film 921 and the insulating film 923. A region where the conductive film 921, the EL layer 924, and the conductive film 925 overlap with one another corresponds to the light-emitting element 17.

In one embodiment of the present invention, the transistors 11 to 15 may include a semiconductor film containing an amorphous, microcrystalline, polycrystalline, or single crystal semiconductor (e.g., silicon or germanium), or a semiconductor film containing a wide bandgap semiconductor (e.g., an oxide semiconductor).

When the semiconductor films of the transistors 11 to 15 are formed using an amorphous, microcrystalline, polycrystalline, or single crystal semiconductor (e.g., silicon or germanium), impurity regions functioning as a source and a drain are formed by addition of an impurity element imparting one conductivity type to the semiconductor films. For example, an impurity region having n-type conductivity can be formed by addition of phosphorus or arsenic to the semiconductor film. Further, an impurity region having p-type conductivity can be formed by addition of boron, for instance, to the semiconductor film.

In the case where an oxide semiconductor is used for the semiconductor films of the transistors 11 to 15, a dopant may be added to the semiconductor films to form impurity regions functioning as a source and a drain. The dopant can be added by ion implantation. Examples of the dopant are a rare gas such as helium, argon, and xenon; and a Group 15 element such as nitrogen, phosphorus, arsenic, and antimony. For example, when nitrogen is used as the dopant, the concentration of nitrogen atoms in the impurity region is preferably from $5\times10^{19}/cm^3$ to $1\times10^{22}/cm^3$.

As a silicon semiconductor, any of the following can be used, for example: amorphous silicon formed by sputtering or vapor phase growth such as plasma CVD, polycrystalline silicon obtained in such a manner that amorphous silicon is crystallized by laser annealing or the like, and single crystal silicon obtained in such a manner that a surface portion of a single crystal silicon wafer is separated by implantation of hydrogen ions or the like into the silicon wafer.

Examples of the oxide semiconductor are indium oxide; tin oxide; zinc oxide; two-component metal oxides such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxides such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component metal oxides such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide refers to an oxide containing In, Ga, and Zn, and there is no limitation on the ratio of In, Ga, and Zn. The In—Ga—Zn-based oxide may contain a metal element other than In, Ga, and Zn.

A material represented by $InMO_3(ZnO)_m$ (m>0 and m is not an integer) may be used as the oxide semiconductor. Note that M represents one or more metal elements selected from Ga, Fe, Mn, and Co. Alternatively, a material expressed by $In_2SnO_5(ZnO)_n$ (n>0 and n is a natural number) may be used as the oxide semiconductor.

For example, an In—Ga—Zn-based oxide with an atomic ratio of In:Ga:Zn=1:1:1 (=1/3: 1/3: 1/3) or In:Ga:Zn=2:2:1 (=2/5: 2/5: 1/5), or an oxide with an atomic ratio close to the above atomic ratios can be used. Alternatively, an In—Sn—Zn-based oxide with an atomic ratio of In:Sn:Zn=1:1:1 (=1/3: 1/3: 1/3), In:Sn:Zn=2:1:3 (=1/3: 1/6: 1/2), or In:Sn:Zn=2:1:5 (=1/4: 1/8: 5/8) or an oxide with an atomic ratio close to the above atomic ratios may be used.

As a stabilizer for reducing variation in electric characteristics of transistors including the oxide semiconductor, tin (Sn), hafnium (Hf), aluminum (Al), zirconium (Zr), and/or titanium (Ti) is/are preferably contained. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

Note that a purified oxide semiconductor (purified OS) obtained by reduction of impurities such as moisture or hydrogen which serves as an electron donor (donor) and by reduction of oxygen defects is an i-type (intrinsic) semiconductor or a substantially i-type semiconductor. Therefore, a transistor including the purified oxide semiconductor has extremely low off-state current. The band gap of the oxide semiconductor is 2 eV or more, preferably 2.5 eV or more, further preferably 3 eV or more. With the use of an oxide semiconductor film that is highly purified by a sufficient decrease in the concentration of impurities such as moisture and hydrogen and a reduction of oxygen defects, the off-state current of a transistor can be decreased.

Specifically, various experiments can prove low off-state current of a transistor in which a purified oxide semiconductor is used for a semiconductor film. For example, the off-state current of even a transistor with a channel width of $1 \times 10^6$ μm and a channel length of 10 μm can be less than or equal to the measurement limit of a semiconductor parameter analyzer, that is, less than or equal to $1 \times 10^{-13}$ A when the voltage between a source electrode and a drain electrode (drain voltage) ranges from 1 V to 10 V. In that case, the off-state current corresponding to a value obtained by dividing the off-state current by the channel width of the transistor is 100 zA/μm or less. In addition, the off-state current was measured using a circuit in which a capacitor and a transistor were connected to each other and charge flowing into or from the capacitor was controlled by the transistor. For the measurement, the transistor in which a channel formation region is formed in a purified oxide semiconductor film was used, and the off-state current of the transistor was measured from a change in the amount of charge of the capacitor per unit time. As a result, it is found that lower off-state current of several tens of yoctoamperes per micrometer (yA/μm) can be obtained when the voltage between the source electrode and the drain electrode of the transistor is 3 V. Consequently, the off-state current of the transistor in which the channel formation region is formed in the purified oxide semiconductor film is significantly lower than that of a transistor using crystalline silicon.

Unless otherwise specified, in the case of an n-channel transistor, the off-state current in this specification is a current that flows between a source and a drain when the potential of a gate is lower than or equal to 0 with the potential of the source as a reference potential while the potential of the drain is higher than those of the source and the gate. Moreover, in the case of a p-channel transistor, the off-state current in this specification is a current that flows between a source and a drain when the potential of a gate is higher than or equal to 0 with the potential of the source as a reference potential while the potential of the drain is lower than those of the source and the gate.

For example, the oxide semiconductor film can be formed by sputtering using a target including indium (In), gallium (Ga), and zinc (Zn). When an In—Ga—Zn-based oxide semiconductor film is formed by sputtering, it is preferable to use an In—Ga—Zn-based oxide target having an atomic ratio of In:Ga:Zn=1:1:1, 4:2:3, 3:1:2, 1:1:2, 2:1:3, or 3:1:4. When an oxide semiconductor film is formed using an In—Ga—Zn-based oxide target having the aforementioned atomic ratio, a polycrystal or a c-axis-aligned crystal (CAAC) is likely to be formed. The filling rate of the target including In, Ga, and Zn is 90% or higher and 100% or lower, preferably 95% or higher and lower than 100%. With the use of the target with high filling rate, a dense oxide semiconductor film is formed.

In the case where an In—Zn-based oxide material is used as the oxide semiconductor, the atomic ratio of metal elements in a target to be used is In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for forming an oxide semiconductor film containing an In—Zn-based oxide with an atomic ratio of In:Zn:O=X:Y:Z, the relation of Z>1.5X+Y is satisfied. The mobility can be increased by keeping the ratio of Zn within the above range.

Specifically, the oxide semiconductor film may be formed as follows: the substrate is held in a treatment chamber with pressure reduced, a sputtering gas from which hydrogen and moisture are removed is introduced while residual moisture in the treatment chamber is removed, and the above-described target is used. The substrate temperature during film formation may be from 100° C. to 600° C., preferably from 200° C. to 400° C. By forming the oxide semiconductor film while the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom and a compound containing a hydrogen atom, such as water ($H_2O$) (preferably, a compound containing a carbon atom as well) are removed, whereby the impurity concentration in the oxide semiconductor film formed in the chamber can be reduced.

Note that the oxide semiconductor film formed by sputtering or the like sometimes contains a large amount of moisture or hydrogen (including a hydroxyl group) as impurities. Moisture and hydrogen easily form a donor level and thus serve as impurities in the oxide semiconductor. In one mode of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra-dry air (the moisture amount is 20 ppm (−55° C. by conversion into a dew point) or less, preferably 1 ppm or less, further preferably 10 ppb or less in the case where measurement is performed by a dew point meter in a cavity ring-down laser spectroscopy (CRDS) method).

By performing heat treatment on the oxide semiconductor film, moisture or hydrogen in the oxide semiconductor film can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When an RTA method is used for the heat treatment, dehydration or dehydrogenation can be performed in a short time; therefore, treatment can be performed even at a temperature higher than the strain point of a glass substrate.

Note that in some cases, the heat treatment makes oxygen released from the oxide semiconductor film and an oxygen defect is formed in the oxide semiconductor film. To prevent an oxygen defect, an insulating film including oxygen is used as an insulating film in contact with the oxide semiconductor film, such as a gate insulating film, in one embodiment of the present invention. Then, heat treatment is performed after formation of the insulating film including oxygen, so that oxygen is supplied from the insulating film to the oxide semiconductor film. With the above structure, oxygen defects serving as donors can be reduced in the oxide semiconductor film and the stoichiometric composition of the oxide semiconductor included in the oxide semiconductor film can be satisfied. It is preferable that the proportion of oxygen in the oxide semiconductor film is higher than that in the stoichiometric composition. As a result, the oxide semiconductor film can be made substantially i-type and variation in electrical characteristics of the transistors due to oxygen defects can be reduced; thus, electrical characteristics can be improved.

The heat treatment for supplying oxygen to the semiconductor film is performed in a nitrogen atmosphere, ultra-dry air, or a rare gas (e.g., argon or helium) atmosphere preferably at temperatures ranging from 200° C. to 400° C., for example, from 250° C. to 350° C. It is preferable that the water content in the gas be 20 ppm or less, preferably 1 ppm or less, further preferably 10 ppb or less.

Further, the oxide semiconductor may be either amorphous or crystalline. In the latter case, the oxide semiconductor may be single crystal or polycrystalline, or may have a structure in which part of the oxide semiconductor is crystalline, an amorphous structure including a crystalline portion, or a non-amorphous structure. As an example of such a partly crystalline structure, an oxide semiconductor including a crystal with c-axis alignment (also referred to as a c-axis-aligned crystalline oxide semiconductor (CAAC-OS)), which has a triangular or hexagonal atomic arrangement when seen from the direction of an a-b plane, a surface, or an interface, may be used. In the crystal, metal atoms are arranged in a layered manner or metal atoms and oxygen atoms are arranged in a layered manner along the c-axis when seen from the direction perpendicular to the c-axis, and the direction of the a-axis or the b-axis is varied in the a-b plane (the crystal rotates around the c-axis).

In a broad sense, a CAAC-OS means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not single crystal, but this does not mean that CAAC-OS is composed of only an amorphous portion. Although the CAAC-OS includes a crystallized portion (crystalline portion), a boundary between one crystalline portion and another crystalline portion is not clear in some cases.

Nitrogen may be substituted for part of oxygen which is a constituent of the CAAC-OS. The c-axes of the crystalline portions included in the CAAC-OS may be aligned in one direction (e.g., a direction perpendicular to a surface of a substrate over which the CAAC-OS is formed or a surface of the CAAC-OS). Alternatively, the normals of the a-b planes of individual crystalline portions included in the CAAC-OS may be aligned in one direction (e.g., the direction perpendicular to a surface of a substrate over which the CAAC-OS is formed or a surface of the CAAC-OS).

The CAAC-OS is a conductor, a semiconductor, or an insulator, which depends on its composition or the like. The CAAC-OS transmits or does not transmit visible light depending on its composition or the like.

An example of such a CAAC-OS is an oxide which is formed into a film shape and has a triangular or hexagonal atomic arrangement when observed from the direction perpendicular to a surface of the film or a surface of a substrate where the film is formed, and in which metal atoms are arranged in a layered manner or metal atoms and oxygen atoms (or nitrogen atoms) are arranged in a layered manner when a cross section of the film is observed.

An example of a crystal structure of the CAAC-OS will be described in detail with reference to FIGS. 14A to 14E, FIGS. 15A to 15C, and FIGS. 16A to 16C. In FIGS. 14A to 14E, FIGS. 15A to 15C, and FIGS. 16A to 16C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). In FIGS. 14A to 14E, O surrounded by a circle represents tetracoordinate O and O surrounded by a double circle represents tricoordinate O.

Figure 14A:
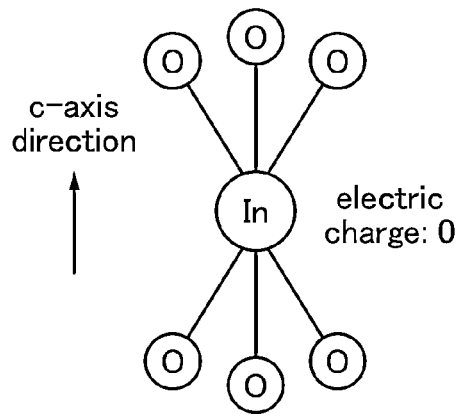
FIGS. 14A to 14E illustrate a structure of an oxide semiconductor.

FIG. 14A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 14A is actually an octahedral structure, but is illustrated as a planar structure for simplicity. Note that three tetracoordinate O atoms exist in each of the upper half and the lower half in FIG. 14A. In the small group illustrated in FIG. 14A, electric charge is 0.

Figure 14D:
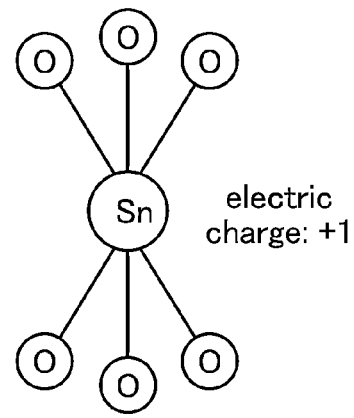
Figure 14B:
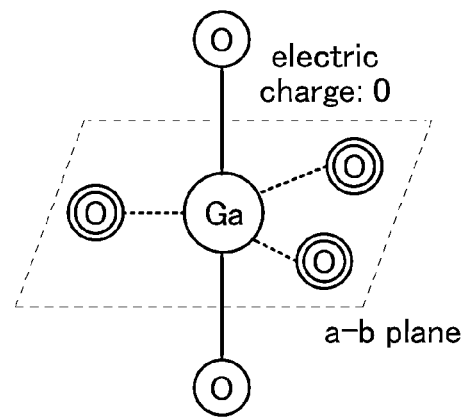

FIG. 14B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of the upper half and the lower half in FIG. 14B. An In atom can also have the structure illustrated in FIG. 14B because an In atom can have five ligands. In the small group illustrated in FIG. 14B, electric charge is 0.

Figure 14E:
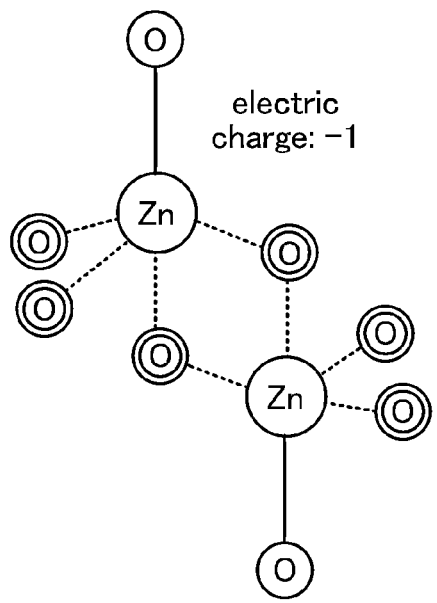
Figure 14C:
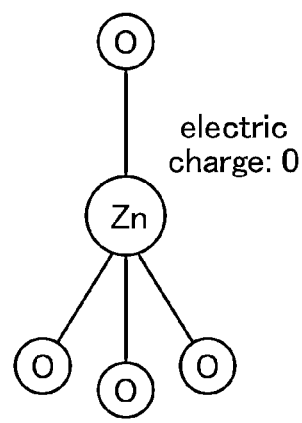

FIG. 14C illustrates a structure including one tetracoordinate Zn atom and four tetracoordinate O atoms proximate to the Zn atom. In FIG. 14C, one tetracoordinate O atom exists in the upper half and three tetracoordinate O atoms exist in the lower half. Alternatively, three tetracoordinate O atoms may exist in the upper half and one tetracoordinate O atom may exist in the lower half in FIG. 14C. In the small group illustrated in FIG. 14C, electric charge is 0.

FIG. 14D illustrates a structure including one hexacoordinate Sn atom and six tetracoordinate O atoms proximate to the Sn atom. Three tetracoordinate O atoms exist in each of the upper half and the lower half in FIG. 14D. In the small group illustrated in FIG. 14D, electric charge is +1.

FIG. 14E illustrates a small group including two Zn atoms. One tetracoordinate O atom exists in each of the upper half and the lower half in FIG. 14E. In the small group illustrated in FIG. 14E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 14A each have three proximate In atoms in the downward direction, and the three O atoms in the lower half each have three proximate In atoms in the upward direction. The one O atom in the upper half with respect to the pentacoordinate Ga atom in FIG. 14B has one proximate Ga atom in the downward direction, and the one O atom in the lower half has one proximate Ga atom in the upward direction. The one O atom in the upper half with respect to the tetracoordinate Zn atom in FIG. 14C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded to each other. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed by combining a plurality of small groups so that the total electric charge of the layered structure is 0.

Figure 15A:
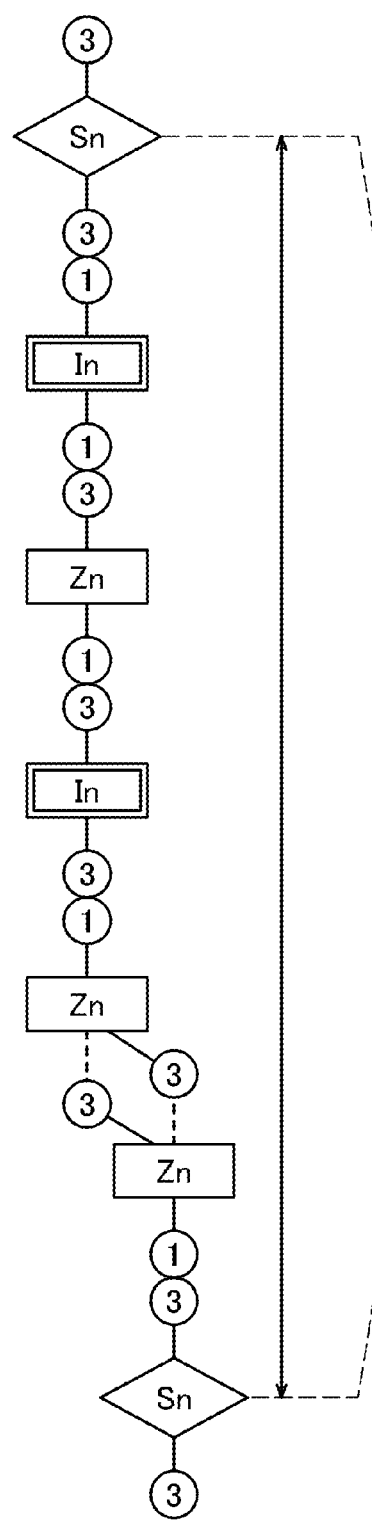
FIGS. 15A to 15C illustrate a structure of an oxide semiconductor.
Figure 15B:
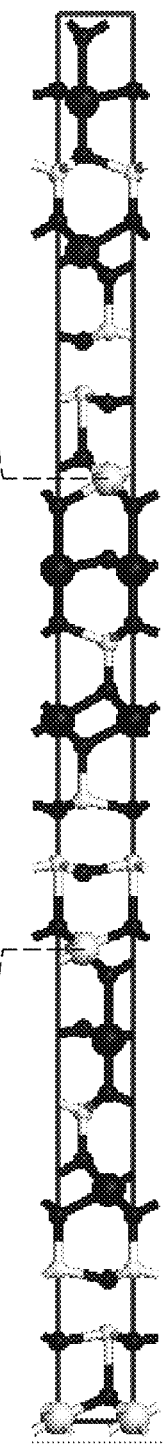
Figure 15C:
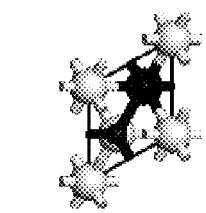

FIG. 15A illustrates a model of a medium group included in a layered structure of an In—Sn—Zn-based oxide. FIG. 15B illustrates a large group including three medium groups. FIG. 15C illustrates an atomic arrangement in the case where the layered structure in FIG. 15B is observed from the c-axis direction.

In FIG. 15A, a tricoordinate O atom is omitted for simplicity, and a tetracoordinate O atom is illustrated by a circle; the number in the circle shows the number of tetracoordinate O atoms. For example, three tetracoordinate O atoms existing in each of the upper half and the lower half with respect to a Sn atom are denoted by circled 3. Similarly, in FIG. 15A, one tetracoordinate O atom existing in each of the upper half and the lower half with respect to an In atom is denoted by circled 1. FIG. 15A also illustrates a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

In the medium group included in the layered structure of the In—Sn—Zn-based oxide in FIG. 15A, in the order starting from the top, a Sn atom proximate to three tetracoordinate O atoms in each of the upper half and the lower half is bonded to an In atom proximate to one tetracoordinate O atom in each of the upper half and the lower half, the In atom is bonded to a Zn atom proximate to three tetracoordinate O atoms in the upper half, the Zn atom is bonded to an In atom proximate to three tetracoordinate O atoms in each of the upper half and the lower half through one tetracoordinate O atom in the lower half with respect to the Zn atom, the In atom is bonded to a small group that includes two Zn atoms and is proximate to one tetracoordinate O atom in the upper half, and the small group is bonded to a Sn atom proximate to three tetracoordinate O atoms in each of the upper half and the lower half through one tetracoordinate O atom in the lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. An example of a structure having electric charge of −1 is the small group including two Zn atoms as illustrated in FIG. 14E. For example, with one small group including two Zn atoms, electric charge of one small group including a Sn atom can be cancelled, so that the total electric charge of the layered structure can be 0.

Specifically, be repeating the large group illustrated in FIG. 15B, an In—Sn—Zn-based oxide crystal ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide.

Figure 16A:
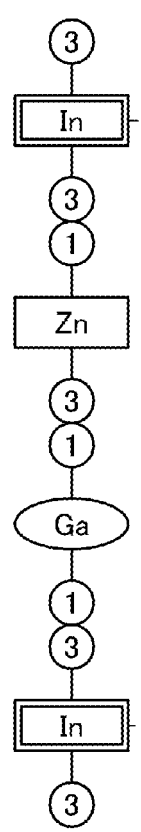
FIGS. 16A to 16C illustrate a structure of an oxide semiconductor.

As an example, FIG. 16A illustrates a model of a medium group included in a layered structure of an In—Ga—Zn-based oxide.

In the medium group included in the layered structure of the In—Ga—Zn-based oxide in FIG. 16A, in the order starting from the top, an In atom proximate to three tetracoordinate O atoms in each of the upper half and the lower half is bonded to a Zn atom proximate to one tetracoordinate O atom in the upper half, the Zn atom is bonded to a Ga atom proximate to one tetracoordinate O atom in each of the upper half and the lower half through three tetracoordinate O atoms in the lower half with respect to the Zn atom, and the Ga atom is bonded to an In atom proximate to three tetracoordinate O atoms in each of the upper half and the lower half through one tetracoordinate O atom in the lower half with respect to the Ga atom. A plurality of such medium groups are bonded, so that a large group is formed.

Figure 16B:
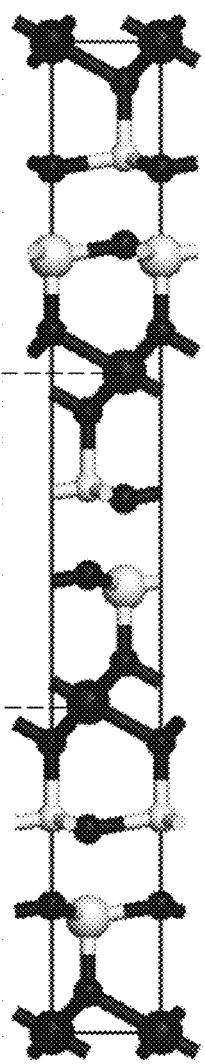
Figure 16C:
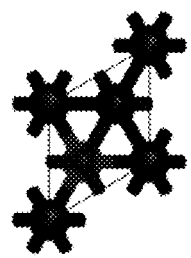

FIG. 16B illustrates a large group consisting of three medium groups. FIG. 16C illustrates an atomic arrangement in the case where the layered structure in FIG. 16B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 16A but also a medium group in which the arrangement of the In atom, the Ga atom, and the Zn atom is different from that in FIG. 16A.

Specifically, by repeating the large group illustrated in FIG. 16B, an In—Ga—Zn-based oxide can be obtained. Note that a layered structure of the obtained In—Ga—Zn-based oxide can be expressed as a composition formula, $InGaO_3(ZnO)_n$ (n is a natural number).

This embodiment can be implemented in combination with any other embodiment.

(Embodiment 3)

In the light-emitting device according to one embodiment of the present invention, a color filter method can be employed, in which full-color images are displayed by using a combination of a color filter and a light-emitting element that emits light of a single color such as white. Alternatively, it is possible to employ a method in which full-color images are displayed by using a plurality of light-emitting elements that emit light of different hues. This method is referred to as a separate coloring method because EL layers each provided between a pair of electrodes in a light-emitting element are separately colored with corresponding colors.

In the separate coloring method, in general, EL layers are separately applied by evaporation with the use of a mask such as a metal mask; therefore, the size of pixels depends on the accuracy of separate coloring of the EL layers by evaporation. On the other hand, unlike the separate coloring method, EL layers do not need to be separately applied in the color filter method. Accordingly, pixels can be downsized more easily than in the separate coloring method; thus, a high-definition pixel portion can be provided.

A light-emitting device includes, in its category, a bottom-emission light-emitting device in which light emitted from a light-emitting element is extracted from an element substrate, over which a transistor is formed; and a top-emission light-emitting device in which light emitted from a light-emitting element is extracted from a side opposite to an element substrate. In the top-emission structure, light emitted from a light-emitting element is not blocked by an element such as a wiring, a transistor, or a storage capacitor, so that the efficiency of light extraction from a pixel can be made higher than in the bottom-emission structure. Therefore, the top-emission structure can achieve high luminance even when the amount of current supplied to a light-emitting element is lowered, and thus is advantageous in improving the lifetime of the light-emitting element.

The light-emitting device according to one embodiment of the present invention may have a microcavity (micro optical resonator) structure in which light emitted from an EL layer resonates within a light-emitting element. With the microcavity structure, light having a specific wavelength can be extracted from the light-emitting element with high efficiency, so that the luminance and the color purity of the pixel portion can be increased.

Figure 10:
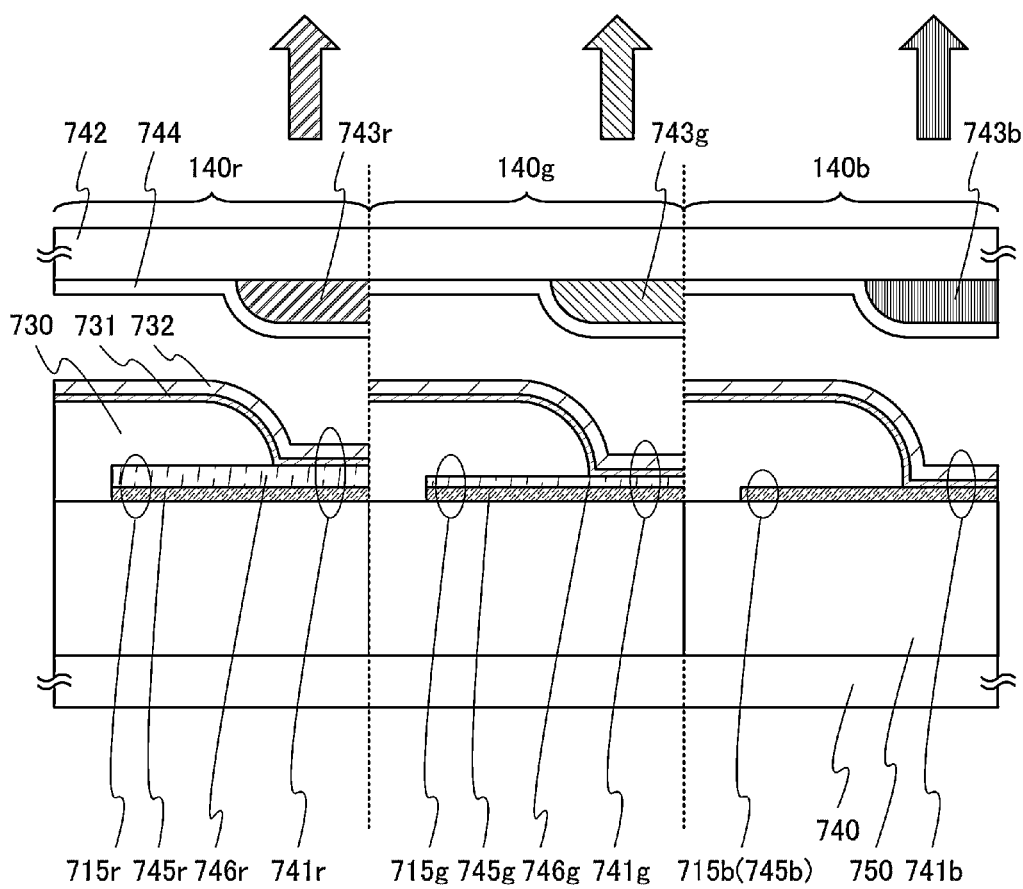
FIG. 10 is a cross-sectional view of pixels.

FIG. 10 is an example of a cross-sectional view of pixels. FIG. 10 illustrates part of a cross section of a pixel corresponding to red, part of a cross section of a pixel corresponding to green, and part of a cross section of a pixel corresponding to blue.

Specifically, FIG. 10 illustrates a pixel 140r corresponding to red, a pixel 140g corresponding to green, and a pixel 140b corresponding to blue. The pixel 140r, the pixel 140g, and the pixel 140b include an anode 715r, an anode 715g, and an anode 715b, respectively. The anodes 715r, 715g, and 715b included in the pixels 140r, 140g, and 140b are provided over an insulating film 750 formed over a substrate 740.

A bank 730 formed using an insulating film is provided over the anodes 715r, 715g, and 715b. The bank 730 has openings, where parts of the anodes 715r, 715g, and 715b are exposed. An EL layer 731 and a cathode 732 that transmits visible light are stacked in this order over the bank 730 so as to cover the above exposed parts.

A portion where the anode 715r, the EL layer 731, and the cathode 732 overlap with one another corresponds to a light-emitting element 741r corresponding to red. A portion where the anode 715g, the EL layer 731, and the cathode 732 overlap with one another corresponds to a light-emitting element 741g corresponding to green. A portion where the anode 715b, the EL layer 731, and the cathode 732 overlap with one another corresponds to a light-emitting element 741b corresponding to blue.

A substrate 742 is provided to face the substrate 740 with the light-emitting elements 741r, 741g, and 741b placed therebetween. A coloring layer 743r corresponding to the pixel 140r, a coloring layer 743g corresponding to the pixel 140g, and a coloring layer 743b corresponding to the pixel 140b are provided on the substrate 742. The coloring layer 743r is a layer whose transmittance of light in a wavelength range corresponding to red is higher than that of light in other wavelength ranges. The coloring layer 743g is a layer whose transmittance of light in a wavelength range corresponding to green is higher than that of light in other wavelength ranges. The coloring layer 743b is a layer whose transmittance of light in a wavelength range corresponding to blue is higher than that of light in other wavelength ranges.

An overcoat 744 is provided on the substrate 742 so as to cover the coloring layers 743r, 743g, and 743b. The overcoat 744 transmits visible light, is provided for protecting the coloring layers 743r, 743g, and 743b, and is preferably formed using a resin material with which planarity can be improved. The coloring layers 743r, 743g, and 743b and the overcoat 744 may be collectively regarded as a color filter, or each of the coloring layers 743r, 743g, and 743b may be regarded as a color filter.

In FIG. 10, a conductive film 745r with high visible-light reflectance and a conductive film 746r with higher visible-light transmittance than the conductive film 745r are stacked in this order to be used as the anode 715r. A conductive film 745g with high visible-light reflectance and a conductive film 746g with higher visible-light transmittance than the conductive film 745g are stacked in this order to be used as the anode 715g. The conductive film 746g has a smaller thickness than the conductive film 746r. A conductive film 745b with high visible-light reflectance is used as the anode 715b.

Thus, in the light-emitting device in FIG. 10, the optical path length of light emitted from the EL layer 731 in the light-emitting element 741r can be adjusted by the distance between the conductive film 745r and the cathode 732. The optical path length of light emitted from the EL layer 731 in the light-emitting element 741g can be adjusted by the distance between the conductive film 745g and the cathode 732. The optical path length of light emitted from the EL layer 731 in the light-emitting element 741b can be adjusted by the distance between the conductive film 745b and the cathode 732.

In one embodiment of the present invention, a microcavity structure may be employed, in which the above optical path lengths are adjusted in accordance with the wavelengths of light emitted from the light-emitting elements 741r, 741g, and 741b so that light emitted from the EL layer 731 resonates within each light-emitting element.

When the microcavity structure is applied to the light-emitting device according to one embodiment of the present invention, light with a wavelength corresponding to red among the light emitted from the light-emitting element 741r resonates in the microcavity structure to enhance its intensity. Consequently, the color purity and luminance of red light obtained through the coloring layer 743r are increased. Light with a wavelength corresponding to green among the light emitted from the light-emitting element 741g resonates in the microcavity structure to enhance its intensity, and the color purity and luminance of green light obtained through the coloring layer 743g are increased as a result. Light with a wavelength corresponding to blue among the light emitted from the light-emitting element 741b resonates in the microcavity structure to enhance its intensity; consequently, the color purity and luminance of blue light obtained through the coloring layer 743b are increased.

Note that although pixels corresponding to three colors of red, green, and blue are shown in FIG. 10, one embodiment of the present invention is not limited to this structure. In one embodiment of the present invention, a combination of four colors of red, green, blue, and yellow or a combination of three colors of cyan, magenta, and yellow may be used. Alternatively, it is possible to use a combination of six colors of pale red, pale green, pale blue, deep red, deep green, and deep blue, or a combination of six colors of red, green, blue, cyan, magenta, and yellow.

Note that colors that can be expressed using pixels of red, green, and blue, for example, are limited to colors existing in the triangle made by the three points on the chromaticity diagram which correspond to the emission colors of the respective pixels. Therefore, by additionally providing a light-emitting element of a color existing outside the triangle on the chromaticity diagram as in the case where pixels of red, green, blue, and yellow are used, the range of the colors that can be expressed in the light-emitting device can be expanded and the color reproducibility can be enhanced as a result.

In FIG. 10, the conductive film 745b with high visible-light reflectance is used as the anode in the light-emitting element 741b which emits light with the shortest wavelength $\lambda$ among the light-emitting elements 741r, 741g, and 741b, and the conductive films 746r and 746g having different thicknesses are used in the other light-emitting elements 741r and 741g; thus, the optical path lengths are adjusted. In one embodiment of the present invention, a conductive film with high visible-light transmittance, like the conductive films 746r and 746g, may be provided over the conductive film 745b with high visible-light reflectance also in the light-emitting element 741b which emits light with the shortest wavelength $\lambda$. However, it is preferable to use the conductive film 745b with high visible-light reflectance as the anode of the light-emitting element 741b which emits light with the shortest wavelength $\lambda$ as shown in FIG. 10, because the fabrication process of the anode can be simplified as compared to the case of using a conductive film with high visible-light transmittance for the anodes of all the light-emitting elements 741r, 741g, and 741b.

Note that the work function of the conductive film 745b with high visible-light reflectance is often smaller than those of the conductive films 746r and 746g with high visible-light transmittance. Accordingly, in the light-emitting element 741b which emits light with the shortest wavelength $\lambda$, holes are less likely to be injected from the anode 715b into the EL layer 731 than in the light-emitting elements 741r and 741g, resulting in low emission efficiency. In view of this, in one embodiment of the present invention, a composite material that contains a substance having a high hole-transport property and a substance having an acceptor property (electron-accepting property) with respect to the substance having a high hole-transport property is preferably used for part of the EL layer 731 that is in contact with the conductive film 745b with high visible-light reflectance in the light-emitting element 741b which emits light with the shortest wavelength $\lambda$. When the above composite material is formed to be in contact with the anode 715b, holes can be easily injected from the anode 715b into the EL layer 731, so that the emission efficiency of the light-emitting element 741b can be increased.

Examples of the substance having an acceptor property are 7,7,8,8-tetracyano-2,3,5,6-tetrafluoroquinodimethane ($F_4$-TCNQ), chloranil, a transition metal oxide, and oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high acceptor properties. Among these, molybdenum oxide is particularly preferable since it is stable in the air, has a low hygroscopic property, and is easily treated.

As the substance having a high hole-transport property used for the composite material, any of a variety of compounds such as an aromatic amine compound, a carbazole derivative, aromatic hydrocarbon, or a high molecular weight compound (e.g., an oligomer, a dendrimer, or a polymer) can be used. The organic compound used for the composite material is preferably an organic compound having a high hole-transport property. Specifically, a substance having a hole mobility of $10^{-6}$ cm$^2$/Vs or higher is preferably used. Note that any other substance may also be used as long as its hole-transport property is higher than its electron-transport property.

The conductive films 745r, 745g, and 745b having high visible-light reflectance can be formed with a single layer or a stack using aluminum, silver, or an alloy containing such a metal material, for example. Alternatively, the conductive films 745r, 745g, and 745b may be formed by stacking a conductive film with high visible-light reflectance and a thin conductive film (preferably with a thickness of 20 nm or less, further preferably 10 nm or less). For example, a thin titanium film or a thin molybdenum film may be stacked over a conductive film with high visible-light reflectance to form the conductive film 745b, in which case an oxide film can be prevented from being formed on a surface of the conductive film with high visible-light reflectance (e.g., aluminum, an alloy containing aluminum, or silver).

The conductive films 746r and 746g with high visible-light transmittance can be formed using, for example, indium oxide, tin oxide, zinc oxide, indium tin oxide, or indium zinc oxide.

The cathode 732 can be formed, for example, by stacking a conductive film thin enough to transmit light (preferably with a thickness of 20 nm or less, further preferably 10 nm or less) and a conductive film including a conductive metal oxide. The conductive film thin enough to transmit light can be formed with a single layer or a stack using silver, magnesium, an alloy containing such a metal material, or the like. Examples of the conductive metal oxide are indium oxide, tin oxide, zinc oxide, indium tin oxide, indium zinc oxide, and any of these metal oxide materials containing silicon oxide.

This embodiment can be implemented in combination with any other embodiment as appropriate.

(Embodiment 4)

In this embodiment, a bottom-emission structure, a top-emission structure, and a dual-emission structure will be described. In the dual-emission structure, light from a light-emitting element is extracted from the element substrate side and the side opposite to the element substrate.

Figure 11A:
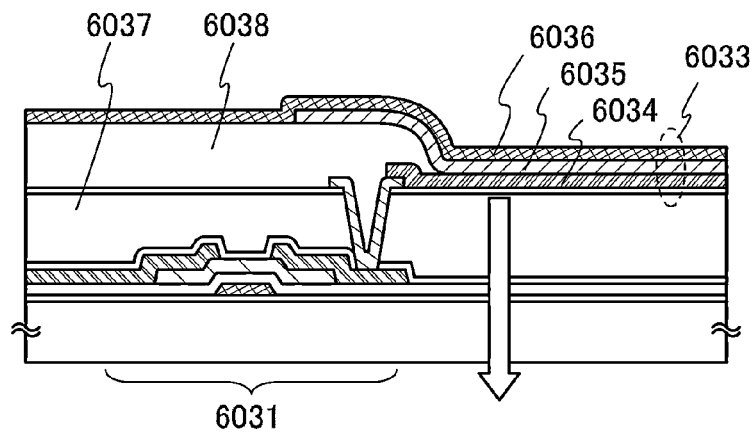
FIGS. 11A to 11C are cross-sectional views of pixels.

FIG. 11A is a cross-sectional view of a pixel in which light emitted from a light-emitting element 6033 is extracted from an anode 6034 side. A transistor 6031 is covered with an insulating film 6037, and a bank 6038 having an opening is formed over the insulating film 6037. In the opening of the bank 6038, the anode 6034 is partially exposed, and the anode 6034, an EL layer 6035, and a cathode 6036 are stacked in this order in the opening.

The anode 6034 is formed using a material through which light passes easily or formed to a thickness such that light passes through the anode 6034 easily. The cathode 6036 is formed using a material through which light is difficult to pass or formed to a thickness such that light is difficult to pass through the cathode 6036. Accordingly, it is possible to obtain a bottom-emission structure in which light is extracted from the anode 6034 side as indicated by an outline arrow.

Figure 11B:
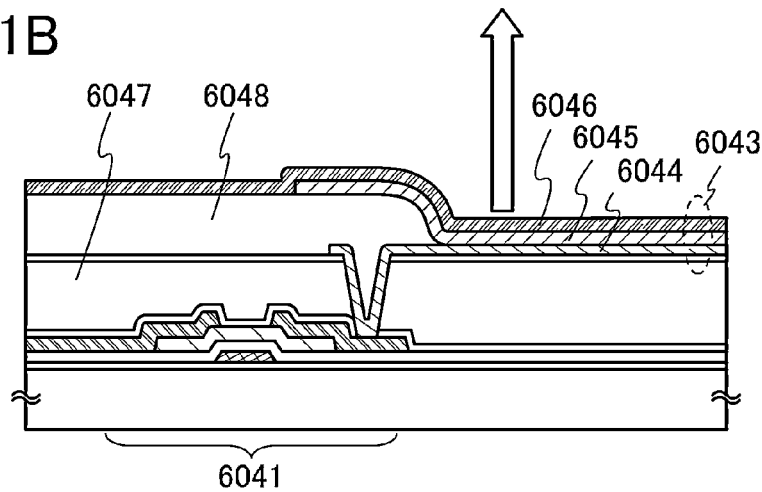

FIG. 11B is a cross-sectional view of a pixel in which light emitted from a light-emitting element 6043 is extracted from a cathode 6046 side. A transistor 6041 is covered with an insulating film 6047, and a bank 6048 having an opening is formed over the insulating film 6047. In the opening of the bank 6048, an anode 6044 is partly exposed, and the anode 6044, an EL layer 6045, and the cathode 6046 are stacked in this order in the opening.

The anode 6044 is formed using a material through which light is difficult to pass or formed to a thickness such that light is difficult to pass through the anode 6044. The cathode 6046 is formed using a material through which light passes easily or formed to a thickness such that light passes through the cathode 6046 easily. Accordingly, it is possible to obtain a top-emission structure in which light is extracted from the cathode 6046 side as indicated by an outline arrow.

Figure 11C:
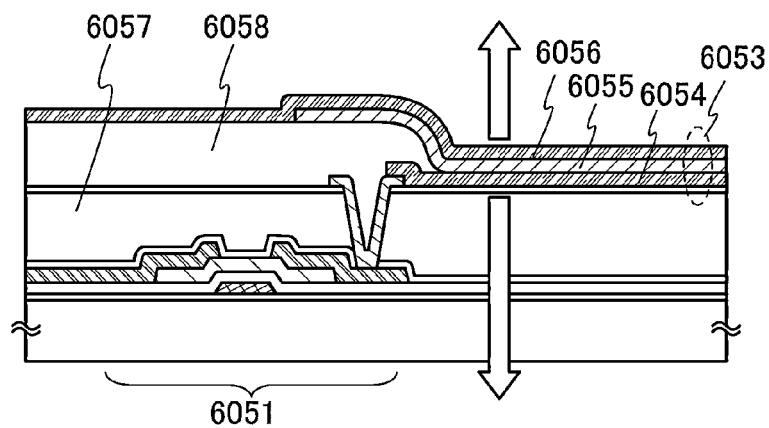

FIG. 11C is a cross-sectional view of a pixel in which light emitted from a light-emitting element 6053 is extracted from an anode 6054 side and a cathode 6056 side. A transistor 6051 is covered with an insulating film 6057, and a bank 6058 having an opening is formed over the insulating film 6057. In the opening of the bank 6058, the anode 6054 is partially exposed, and the anode 6054, an EL layer 6055, and the cathode 6056 are stacked in this order in the opening.

The anode 6054 and the cathode 6056 are formed using a material through which light passes easily or formed to a thickness such that light passes through the anode 6054 and the cathode 6056 easily. Accordingly, it is possible to obtain a dual-emission structure in which light is extracted from the anode 6054 side and the cathode 6056 side as indicated by outline arrows.

For the electrodes serving as the anode and the cathode, any of metals, alloys, electrically conductive compounds, and mixtures thereof can be used, for example. Specific examples are indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti). Other examples are elements belonging to Group 1 or Group 2 of the periodic table, for instance, an alkali metal such as lithium (Li) and cesium (Cs), an alkaline earth metal such as calcium (Ca) and strontium (Sr), magnesium (Mg), an alloy containing such an element (e.g., MgAg and AlLi), a rare earth metal such as europium (Eu) and ytterbium (Yb), an alloy containing such an element, and graphene. The electrodes are formed using materials selected from the above as appropriate and formed to have an optimal thickness, thereby achieving a bottom-emission structure, a top-emission structure, or a dual-emission structure.

This embodiment can be implemented in combination with any other embodiment as appropriate.

(Embodiment 5)

Figure 12:
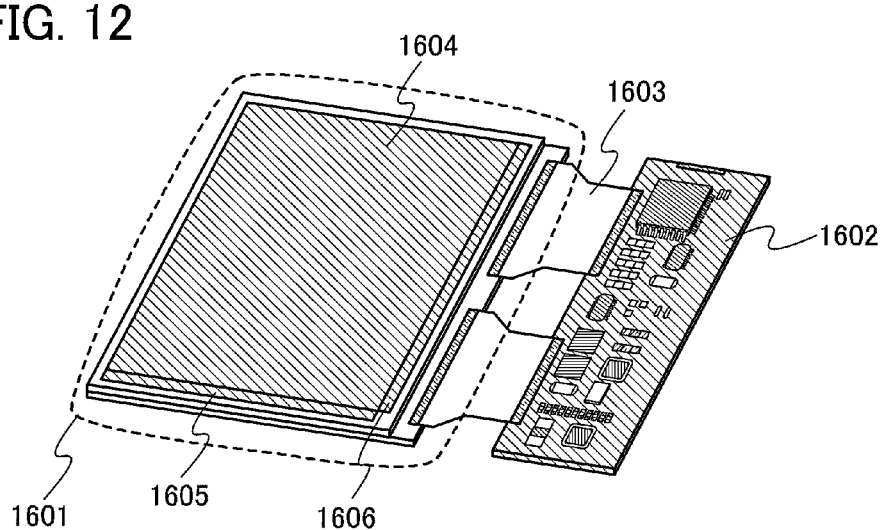
FIG. 12 is a perspective view of a panel.

FIG. 12 is an example of a perspective view of the light-emitting device according to one embodiment of the present invention.

The light-emitting device illustrated in FIG. 12 includes a panel 1601, a circuit board 1602, and connection portions 1603. The panel 1601 includes a pixel portion 1604 including a plurality of pixels, a scan line driver circuit 1605 that selects pixels per row, and a signal line driver circuit 1606 that controls input of an image signal to the pixels in a selected row. Specifically, signals input to the wirings G1 to G3 are generated in the scan line driver circuit 1605.

Various signals and power supply potentials are input to the panel 1601 through the connection portions 1603 from the circuit board 1602. For the connection portion 1603, a flexible printed circuit (FPC) can be used, for example. In the case where a COF tape is used as the connection portion 1603, part of the circuit in the circuit board 1602 or part of the scan line driver circuit 1605 or the signal line driver circuit 1606 included in the panel 1601 may be formed on a chip separately prepared, and the chip may be connected to a COF tape by a COF (chip on film) method.

This embodiment can be implemented in combination with any other embodiment.

(Embodiment 6)

The light-emitting device according to one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the light-emitting device according to one embodiment of the present invention are mobile phones, game machines including portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 13A to 13E illustrate specific examples of these electronic devices.

Figure 13A:
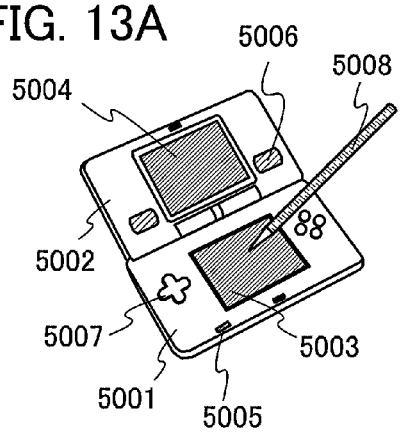
FIGS. 13A to 13E illustrate electronic devices.

FIG. 13A illustrates a portable game machine including a housing 5001, a housing 5002, a display portion 5003, a display portion 5004, a microphone 5005, a speaker 5006, an operation key 5007, a stylus 5008, and the like. The light-emitting device according to one embodiment of the present invention can be used as the display portion 5003 or the display portion 5004. By using the light-emitting device according to one embodiment of the present invention as the display portion 5003 or the display portion 5004, a portable game machine with high image quality can be provided. Note that although the portable game machine in FIG. 13A includes the two display portions 5003 and 5004, the number of display portions included in the portable game machine is not limited to two.

Figure 13B:
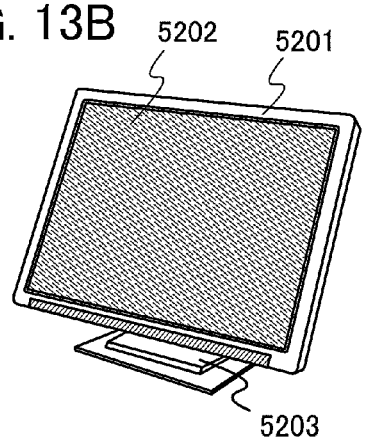

FIG. 13B illustrates a display device including a housing 5201, a display portion 5202, a support base 5203, and the like. The light-emitting device according to one embodiment of the present invention can be used as the display portion 5202. By using the light-emitting device according to one embodiment of the present invention as the display portion 5202, a display device with high image quality can be provided. Note that a display device includes, in its category, any display device for displaying information, such as display devices for personal computers, TV broadcast reception, and advertisement.

Figure 13C:
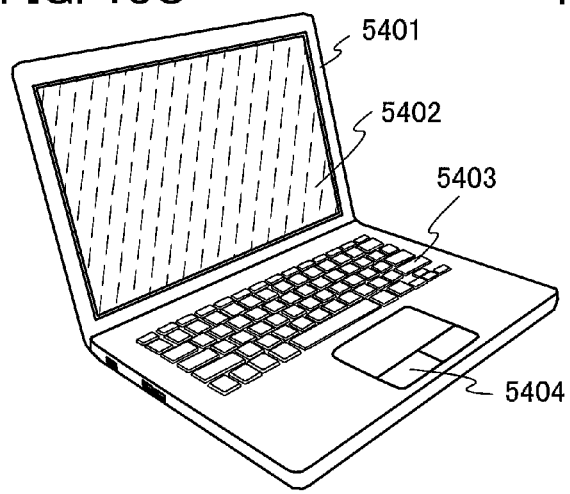

FIG. 13C illustrates a laptop personal computer including a housing 5401, a display portion 5402, a keyboard 5403, a pointing device 5404, and the like. The light-emitting device according to one embodiment of the present invention can be used as the display portion 5402. By using the light-emitting device according to one embodiment of the present invention as the display portion 5402, a laptop personal computer with high image quality can be provided.

Figure 13D:
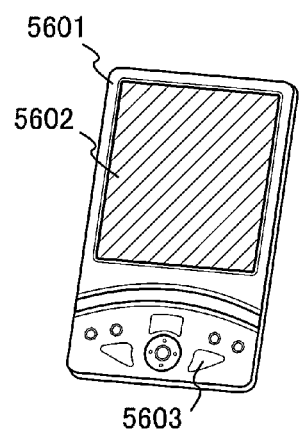

FIG. 13D illustrates a personal digital assistant including a housing 5601, a display portion 5602, operation keys 5603, and the like. In the personal digital assistant in FIG. 13D, a modem may be incorporated in the housing 5601. The light-emitting device according to one embodiment of the present invention can be used as the display portion 5602. By using the light-emitting device according to one embodiment of the present invention as the display portion 5602, a personal digital assistant with high image quality can be provided.

Figure 13E:
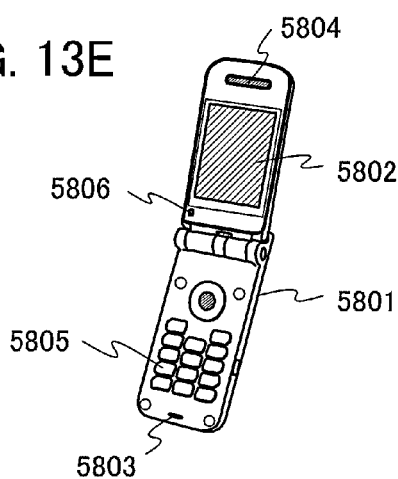

FIG. 13E illustrates a mobile phone including a housing 5801, a display portion 5802, an audio input portion 5803, an audio output portion 5804, operation keys 5805, a light-receiving portion 5806, and the like. Light received in the light-receiving portion 5806 is converted into electrical signals, whereby external images can be loaded. The light-emitting device according to one embodiment of the present invention can be used as the display portion 5802. By using the light-emitting device according to one embodiment of the present invention as the display portion 5802, a mobile phone with high image quality can be provided.

This embodiment can be implemented in combination with any other embodiment as appropriate.

(Embodiment 7)

In this embodiment, a gate voltage Vgs of the transistor 11 in the third period of the operation of the pixel 100 in FIG. 1A, which is described in Embodiment 1, was obtained by calculation.

The calculation was performed under Condition A and Condition B with different values of the potential V0 of the wiring IL. Table 1 shows specific potentials of the wirings under Condition A and Condition B. A potential GVDD corresponds to a high-level potential applied to the wirings G1, G2, and G3. A potential GVSS corresponds to a low-level potential applied to the wirings G1, G2, and G3. Note that in Table 1, the potential Vcat is 0 V, and values of the potential Vdata, the potential Vano, the potential V0, the potential GVDD, and the potential GVSS are represented by a potential difference with respect to the potential Vcat.

TABLE 1

|  | Condition A | Condition B |
|---|---|---|
| Vth | −3 V to 3 V | −3 V to 3 V |
| Vdata | 10 V to 15 V | 14 V to 19 V |
| V0 | 10 V | 14 V |
| Vano | 14 V | 14 V |
| Vcat | 0 V | 0 V |
| GVDD/GVSS | 20 V/0 V | 25 V/0 V |

As for the channel width W to channel length L ratio of the transistors in the calculation, W/L of the transistor 11 was 3 μm/9 μm and W/L of the transistors 12 to 15 was 3 μm/3 μm. Assuming that a region A is a region where the conductive film functioning as the source or the drain is in contact with the semiconductor film in all the transistors included in the pixel 100 in FIG. 1A, the length (Lov) in the channel length direction of a region in which the region A overlaps with a region where the gate electrode is formed was 1.5 μm.

In the third period, the gate voltage Vgs of the transistor 11 was Vdata−V0+Vth as illustrated in FIG. 3C. Thus, the equation Vgs−Vth=Vdata−V0 holds in the pixel 100 in FIG. 1A, so that Vgs−Vth is ideally constant regardless of the value of the threshold voltage Vth.

Figure 17:
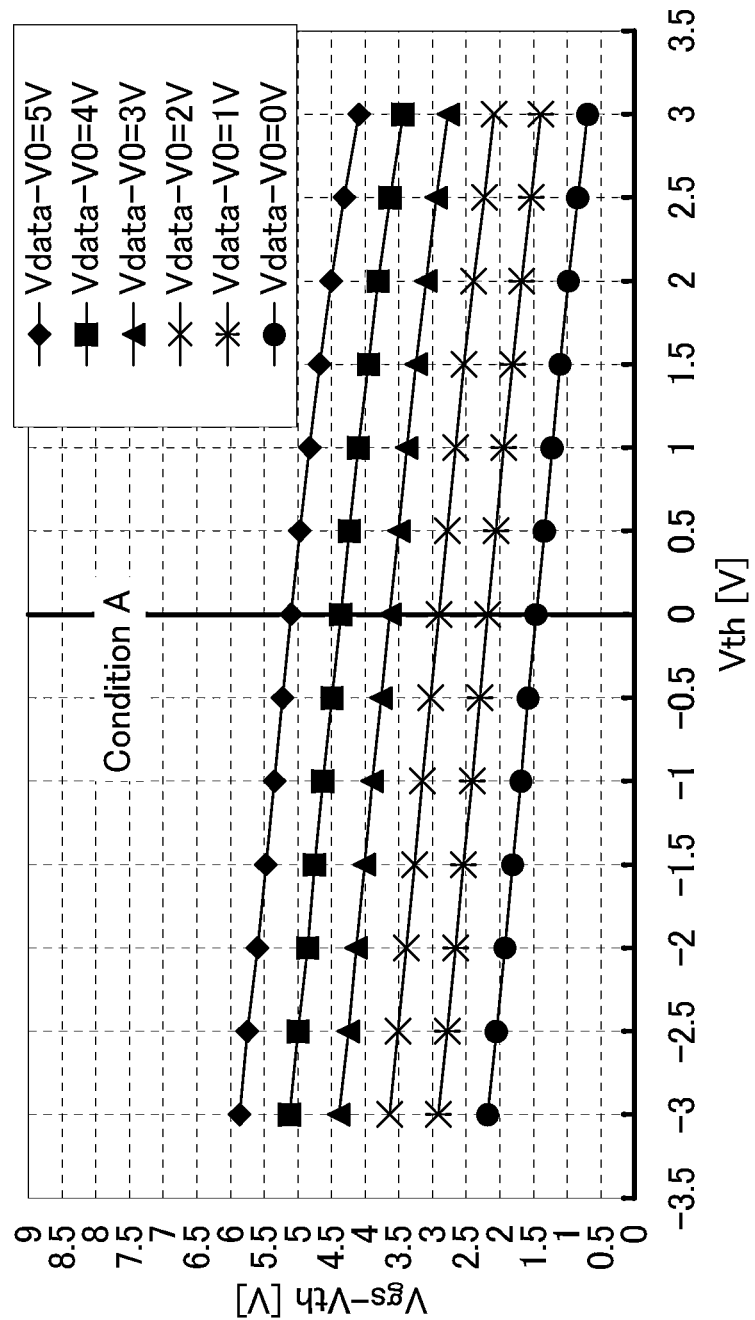
FIG. 17 shows a calculation result.

FIG. 17 shows Vgs−Vth obtained by the calculation under Condition A. In FIG. 17, the horizontal axis represents the threshold voltage Vth (V) and the vertical axis represents Vgs−Vth (V). It is found from FIG. 17 that the values of Vgs−Vth are almost constant even when the threshold voltage Vth is changed, and the variation in Vgs–Vth is limited to less than about 25% to 30%.

Figure 18:
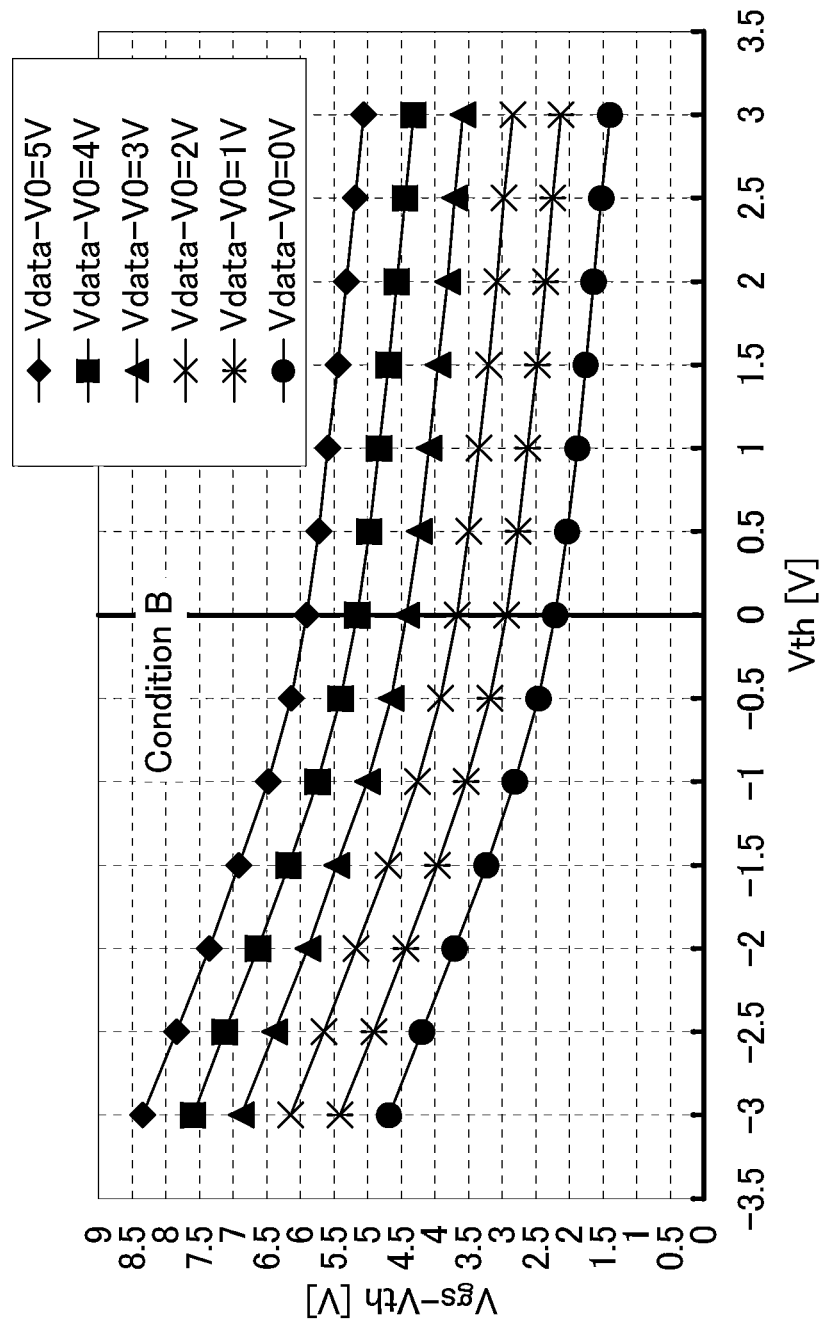
FIG. 18 shows a calculation result.

FIG. 18 shows Vgs–Vth obtained by the calculation under Condition B. In FIG. 18, the horizontal axis represents the threshold voltage Vth (V) and the vertical axis represents Vgs–Vth (V). In FIG. 18, the values of Vgs–Vth are almost constant when the threshold voltage Vth is positive. In contrast, when the threshold voltage Vth is negative, Vgs–Vth is larger as the threshold voltage Vth of negative polarity is higher, which means Vgs–Vth depends on the threshold voltage Vth.

The results of the calculation prove that in the light-emitting device according to one embodiment of the present invention, the gate voltage Vgs of the transistor 11 can be set at a value to which the threshold voltage Vth of the transistor 11 is added, even when the transistor 11 is a normally-on transistor, that is, when the threshold voltage Vth is negative.

This embodiment can be implemented in combination with any other embodiment.

EXPLANATION OF REFERENCE

11: transistor, 12: transistor, 13: transistor, 14: transistor, 15: transistor, 16: capacitor, 17: light-emitting element, 100: pixel, 140b: pixel, 140g: pixel, 140r: pixel, 715b: anode, 715g: anode, 715r: anode, 730: bank, 731: EL layer, 732: cathode, 740: substrate, 741b: light-emitting element, 741g: light-emitting element, 741r: light-emitting element, 742: substrate, 743b: coloring layer, 743g: coloring layer, 743r: coloring layer, 744: overcoat, 745b: conductive film, 745g: conductive film, 745r: conductive film, 746g: conductive film, 746r: conductive film, 750: insulating film, 800: substrate, 801: conductive film, 802: gate insulating film, 803: semiconductor film, 804: conductive film, 805: conductive film, 806: semiconductor film, 807: conductive film, 808: conductive film, 809: conductive film, 810: conductive film, 811: semiconductor film, 812: conductive film, 813: semiconductor film, 814: conductive film, 815: conductive film, 816: conductive film, 817: semiconductor film, 818: conductive film, 819: conductive film, 820: insulating film, 821: insulating film, 822: conductive film, 823: contact hole, 824: insulating film, 825: EL layer, 826: conductive film, 900: substrate, 901: semiconductor film, 902: gate insulating film, 903: conductive film, 904: conductive film, 905: conductive film, 906: semiconductor film, 907: conductive film, 908: conductive film, 909: conductive film, 911: conductive film, 912: semiconductor film, 913: conductive film, 914: conductive film, 915: conductive film, 916: conductive film, 917: conductive film, 920: insulating film, 921: conductive film, 922: contact hole, 923: insulating film, 924: EL layer, 925: conductive film, 1601: panel, 1602: circuit board, 1603: connection portion, 1604: pixel portion, 1605: scan line driver circuit, 1606: signal line driver circuit, 5001: housing, 5002: housing, 5003: display portion, 5004: display portion, 5005: microphone, 5006: speaker, 5007: operation key, 5008: stylus, 5201: housing, 5202: display portion, 5203: support base, 5401: housing, 5402: display portion, 5403: keyboard, 5404: pointing device, 5601: housing, 5602: display portion, 5603: operation key, 5801: housing, 5802: display portion, 5803: audio input portion, 5804: audio output portion, 5805: operation key, 5806: light-receiving portion, 6031: transistor, 6033: light-emitting element, 6034: anode, 6035: EL layer, 6036: cathode, 6037: insulating film, 6038: bank, 6041: transistor, 6043: light-emitting element, 6044: anode, 6045: EL layer, 6046: cathode, 6047: insulating film, 6048: bank, 6051: transistor, 6053: light-emitting element, 6054: anode, 6055: EL layer, 6056: cathode, 6057: insulating film, 6058: bank This application is based on Japanese Patent Applications serial No. 2011-161103 and No. 2011-259828 filed with Japan Patent Office on Jul. 22, 2011 and Nov. 29, 2011, respectively, the entire contents of which are hereby incorporated by reference.

The invention claimed is:

1. A light-emitting device comprising:
a first wiring;
a second wiring; and
a pixel comprising:
   a transistor;
   a first switch;
   a second switch;
   a third switch;
   a fourth switch;
   a capacitor; and
   a light-emitting element,
wherein the first wiring and a first electrode of the capacitor are electrically connected to each other through the first switch,
wherein a second electrode of the capacitor is electrically connected to a first terminal of the transistor,
wherein the second wiring and a gate of the transistor are electrically connected to each other through the second switch,
wherein the first electrode of the capacitor and the gate of the transistor are electrically connected to each other through the third switch,
wherein the first terminal of the transistor is directly connected to a first terminal of the fourth switch, and
wherein an anode of the light-emitting element is directly connected to a second terminal of the fourth switch.

2. The light-emitting device according to claim 1, wherein the transistor comprises an oxide semiconductor film comprising a channel formation region.

3. The light-emitting device according to claim 1, wherein the transistor is an n-channel transistor.

4. The light-emitting device according to claim 3, wherein the first to fourth switches are n-channel transistors.

5. The light-emitting device according to claim 3, wherein the light-emitting element comprises the anode over the transistor, an EL layer over the anode, and a cathode over the EL layer.

6. A method for driving a light-emitting device comprising:
a first wiring;
a second wiring; and
a pixel comprising:
   a transistor;
   a first switch;
   a second switch;
   a third switch;
   a fourth switch;
   a capacitor; and
   a light-emitting element,
wherein the first wiring and a first electrode of the capacitor are electrically connected to each other through the first switch,
wherein a second electrode of the capacitor is electrically connected to a first terminal of the transistor,
wherein the second wiring and a gate of the transistor are electrically connected to each other through the second switch, wherein the first electrode of the capacitor and the gate of the transistor are electrically connected to each other through the third switch, wherein the first terminal of the transistor is directly connected to a first terminal of the fourth switch, and wherein an anode of the light-emitting element is directly connected to a second terminal of the fourth switch, the method comprising the steps of:
supplying an anode potential to a second terminal of the transistor;
supplying a cathode potential to a cathode of the light-emitting element;
turning off the first switch, the second switch, and the third switch in a first period; and
turning on the fourth switch in the first period, wherein the anode potential is higher than the sum of a threshold voltage of the light-emitting element and the cathode potential.

7. The method for driving the light-emitting device according to claim 6, further comprising the steps of:
supplying a first potential corresponding to an image signal to the first wiring;
supplying a second potential to the second wiring;
turning on the first switch and the second switch in a second period; and
turning off the third switch and the fourth switch in the second period, wherein the second potential is higher than the sum of the cathode potential, a threshold voltage of the transistor, and the threshold voltage of the light-emitting element, and wherein the second potential is lower than the sum of the anode potential and the threshold voltage of the transistor.

8. The method for driving the light-emitting device according to claim 7, further comprising the steps of:
turning off the first switch and the second switch in a third period; and
turning on the third switch and the fourth switch in the third period.

9. The method for driving the light-emitting device according to claim 8, wherein the fourth switch is turned off after the first switch and the second switch are turned on in the second period.

10. The method for driving the light-emitting device according to claim 9, wherein the light-emitting element comprises the anode over the transistor, an EL layer over the anode, and the cathode over the EL layer.

* * * * *